US006967862B2

(12) United States Patent
Hidaka

(10) Patent No.: US 6,967,862 B2
(45) Date of Patent: Nov. 22, 2005

(54) SEMICONDUCTOR MEMORY DEVICE WITH MAGNETIC DISTURBANCE REDUCED

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/615,777

(22) Filed: Jul. 10, 2003

(65) Prior Publication Data

US 2004/0151052 A1 Aug. 5, 2004

(30) Foreign Application Priority Data

Feb. 3, 2003 (JP) ....................................... 2003-026395

(51) Int. Cl.[7] ................................................ G11C 11/00
(52) U.S. Cl. .................................. 365/158; 365/230.06
(58) Field of Search ............................ 365/158, 203.06, 365/171, 173, 189.01

(56) References Cited

U.S. PATENT DOCUMENTS 6,256,224 B1 * 7/2001 Perner et al. ............... 365/173
6,493,259 B1 * 12/2002 Swanson et al. ............ 365/158
6,577,527 B2 6/2003 Freitag et al.
6,577,528 B2 * 6/2003 Gogl et al. ................. 365/158
6,714,442 B1 * 3/2004 Nahas ........................ 365/158
6,714,443 B2 * 3/2004 Ooishi ........................ 365/171
6,856,538 B2 * 2/2005 Hidaka ....................... 365/171
2002/0172073 A1 11/2002 Hidaka

FOREIGN PATENT DOCUMENTS

JP 2002-170375 6/2002

OTHER PUBLICATIONS

Scheuerlein, et al. “A 10ns Read and Write Non–Volatile Memory Array Using a Magnetic Tunnel Junction and FET Switch In Each Cell” IEEE International Solid–State Circuits Conference (2000) TA 7.2.
Durlam, et al. “Nonvolatile RAM Based on Magnetic Tunnel Junction Elements” IEEE International Solid–State Circuits Conference (2000) TA 7.3.
Naji, et al. “A 256kb 3.0V 1T1MJT Nonvolatile Magnetoresistive RAM” IEEE International Solid–State Circuits Conference (2001) TA 7.6.

* cited by examiner

*Primary Examiner*—Anh Phung
(74) *Attorney, Agent, or Firm*—McDermott Will & Emery LLP

(57) ABSTRACT

In writing data, when a bit line is selected and a data write current is caused to flow the selected bit line, a cancel current for canceling a magnetic field induced by the data write current is caused to flow in the direction opposite to the data write current on the selected bit line through a bit line adjacent to the selected bit line. Magnetic field interference between adjacent memory cells to each other is suppressed in a magnetic semiconductor memory device.

18 Claims, 17 Drawing Sheets

FIG.11

| | | WD=H (WRITING OF "0") | | WD=L (WRITING OF "1") | |
|---|---|---|---|---|---|
| | NOT SELECTED | BLj SELECTED | ADJACENT BL SELECTED | BLj SELECTED | ADJACENT BL SELECTED |
| $\phi$1PL | H | H | H | L | H |
| $\phi$1NL | L | H | L | L | L |
| $\phi$2PL | H | H | L | H | H |
| $\phi$2NL | L | L | L | L | H |
| $\phi$1PR | H | L | H | H | H |
| $\phi$1NR | L | L | L | H | L |
| $\phi$2PR | H | H | H | H | L |
| $\phi$2NR | L | L | H | L | L |
| CURRENT DIRECTION OF BLj | X | L←R | L→R | L→R | L←R |

| | NOT SELECTED | SELECTED CSLj-1 | | SELECTED CSLj+1 | |
|---|---|---|---|---|---|
| | | WDj-1 =H | WDj-1 =L | WDj+1 =H | WDj+1 =L |
| φ2PL | H | L | H | L | H |
| φ2NL | L | L | H | L | H |
| φ2PR | H | H | L | H | L |
| φ2NR | L | H | L | H | L |
| CURRENT DIRECTION OF BLj | X | L→R | L←R | L→R | L←R |

FIG.20

| CSLj-1 | CSLj+1 | WDj-1 | WDj+1 | $\phi$3PL | $\phi$3NL | $\phi$4PL | $\phi$4NL | BLj CURRENT |
|---|---|---|---|---|---|---|---|---|
| L | L | - | - | H | L | H | L | 0 |
| L | H | - | H | H | L | L | L | ΔIW → |
| L | H | - | L | H | L | H | H | ΔIW ← |
| H | L | L | - | H | H | H | L | ΔIW ← |
| H | L | H | - | L | L | H | L | ΔIW → |
| H | H | L | L | H | H | H | H | 2・ΔIW ← |
| H | H | L | H | H | L | H | L | 0 |
| H | H | H | L | H | L | H | L | 0 |
| H | H | H | H | L | L | L | L | 2・ΔIW → |

FIG.22

| CSLj-1 | CSLj+1 | WDj-1 | WDj+1 | φ3PR | φ3NR | φ4PR | φ4NR | BLj CURRENT |
|---|---|---|---|---|---|---|---|---|
| L | L | - | - | H | L | H | L | 0 |
| L | H | - | H | H | L | H | H | ΔIW → |
| L | H | - | L | H | L | L | L | ΔIW ← |
| H | L | L | - | L | L | H | L | ΔIW ← |
| H | L | H | - | H | H | H | L | ΔIW → |
| H | H | L | L | L | L | L | L | 2·ΔIW ← |
| H | H | L | H | H | L | H | L | 0 |
| H | H | H | L | H | L | H | L | 0 |
| H | H | H | H | H | H | H | H | 2·ΔIW → |

SEMICONDUCTOR MEMORY DEVICE WITH MAGNETIC DISTURBANCE REDUCED

BACKGROUND OF THE INVENTION

1. Field of the Invention

The present invention relates to a semiconductor memory device and, particularly, to a magnetic semiconductor memory device having a magnetic memory cell for storing information in accordance with a magnetization direction of a magnetic substance. More specifically, the present invention relates to a configuration for reducing magnetic disturbance at the time of writing data in a magnetic semiconductor memory device.

2. Description of the Background Art

An MRAM (Magnetic Random Access Memory) attracts a strong attention as a memory device capable of storing data in a nonvolatile manner with low power consumption. The MRAM utilizes the characteristics that magnetization generated in a ferromagnetic material by an externally applied magnetic field remains in the ferromagnetic material after removal of the external magnetic field. By changing the magnetization direction of residual magnetization in the ferromagnetic material in accordance with data, data is stored. As data storing elements of memory cells of such an MRAM, a giant magneto-resistance element (GMR element), a colossal magneto-resistance element (CMR element), and a tunneling magneto-resistance element (TMR element) are known.

For the structure of a data storing part of an MRAM cell, two magnetic layers are stacked with an insulating film sandwiched in between. The magnetization direction of one of the two magnetic layers is used as a reference magnetization direction and the magnetization direction of the other magnetic layer is changed according to storage data. Magnetic resistance varies according to match or mismatch of the magnetization directions of the magnetic layers and, accordingly, a current flowing via the storing part varies. By detecting the current flowing via the magnetic layers of the storing part, data is read. In writing data, the magnetization direction of the magnetic layer for storing data is set according to storage data by a magnetic field induced by current flow.

An example of the configuration of such an MRAM is disclosed in, for example, a prior art literature 1 (Japanese Patent Laying-Open No. 2002-170375).

In prior art literature 1, for a data storing element in a memory cell, a TMR element is used. In the TMR element of prior art literature 1, a hard layer of high coercive force and a soft layer of low coercive force are disposed so as to face each other with a tunnel insulation film sandwiched in between. According to the magnetization direction of the hard layer, data "0" or "1" is stored.

In writing data, a current is caused to flow in a predetermined direction through a write line (write word line). The magnetization direction of the soft layer is determined by a magnetic field induced by the current flowing in the write line, while the magnetization direction of the hard layer is not changed by the magnetic field induced by the current flowing in the write line. In this state, a current is caused to flow in the direction according to storage data through a bit line connected to the hard layer. By a combined magnetic field of perpendicularly intersecting magnetic fields induced by currents flowing in the write line and the bit line, the magnetization direction of the hard layer is determined and data is accordingly stored.

Data stored in the TMR element of the prior art literature 1 is read in three stages. First, a current is conducted in a predetermined direction in a write line to set the magnetization direction of the soft layer to a predetermined direction. Subsequently, the TMR element is electrically connected to a ground node via an access transistor. In this state, a read current is conducted to the bit line and a voltage according to the current flowing from the bit line via the TMR element in the memory cell is stored into a first sense node of a sense amplifier. TMR element provides a reduced resistance to cause a large current flow when the hard layer and the soft layer are the same in magnetization direction, while providing a large resistance to cause a reduced current flow when the hard layer and the soft layer are different in magnetization direction from each other. Thus, in this first stage, information according to whether or not the magnetization direction of the hard layer is the same as that of the soft layer is stored in the first sense node of the sense amplifier.

Then, the magnetization direction of the soft layer is inverted by flowing current in the reverse direction through the write line. The TMR element is connected again to the ground node in this state and a voltage according to the current (current flowing from the bit line via the TMR element) is stored into a second sense node of the sense amplifier.

Subsequently, by differentially amplifying the voltages at the first and second sense nodes of the sense amplifier, data is read. Specifically, the amount of current flowing in the bit line when the magnetization direction of the hard layer is the same as the initialization magnetization direction of the soft layer is different from the current amount when the magnetization direction of the hard layer is different from the initialization magnetization direction of the soft layer. Therefore, voltages of different levels are stored at the first and second sense nodes of the sense amplifier. By differentially amplifying the voltages of the first and second sense nodes, data stored in the TMR element is read.

Changing the magnetization direction of the soft layer to the initialization direction and then to the opposite direction is made for the following reason. In data writing, the directions of the current flow through the write line and bit line vary according to the write data. Therefore, the magnetization direction of the soft layer might differ for different write data. Consequently, the magnetization direction of the soft layer is initialized to a predetermined direction to ensure accurately set the magnetization direction of the soft layer in data reading.

In the prior art literature 1, in reading data, to read complementary data to the sense nodes, the magnetization direction of the soft layer is inverted. At the time of inverting the magnetization, the current flowing in the write line is inverted. When a noise induced by inversion of the current in the write line occurs on the bit line and the noise is superimposed on the voltages read on the sense nodes of the sense amplifier, an accurate sensing operation cannot be performed. To prevent erroneous reading of data due to the induction noise on the bit line, in the prior art literature 1, a countermeasure for preventing the induction noise from reaching the sense node in the sense amplifier at the time of inverting the magnetization of the soft layer is taken. For the countermeasure, a countermeasure of setting a bit line in a floating state at the time of inverting the magnetization, a countermeasure of connecting inductance between the sense amplifier and the bit line to reduce induction noise, and a countermeasure of connecting the bit line to the ground node at the time of inverting the magnetization to discharge the induction noise to the ground node are proposed.

In the prior art literature 1, it is considered that, at the time of reading data, the induction noise occurring when the magnetization of the soft layer is inverted is prevented from exerting an adverse influence on the data reading. However, the prior art literature 1 does not consider an influence of the magnetic field, induced by the currents flowing in the write line and the bit line at the time of writing data, on the TMR elements of memory cells in an adjacent column or an adjacent row. The prior art stands on the position that the magnetization of the hard layer is inverted only by the combined magnetic field of magnetic fields induced by the currents flowing in the write line and the bit line and the magnetization of the hard layer is not inverted by the magnetic field induced by the current in only either the bit line or the write line.

However, when memory cells are disposed in high density and the intervals of adjacent memory cells are narrowed, the magnetic field induced by the current flowing in the write line and/or bit line also exerts an influence on an adjacent memory cell. Such a leakage magnetic field provides magnetic noise (magnetic field interference or magnetic disturbance) to a non-selected memory cell. Since a current of a predetermined magnitude flows in the bit line and the write line, such a situation that write data in a non-selected adjacent memory cell is inverted by such magnetic noise occurs.

In writing data of a plurality of bits, when simultaneously selecting adjacent memory cells, write currents have to be supplied to adjacent bit lines. In this case, if the logic levels of the write data are opposite, it is necessary to supply current to selected bit lines in the opposite directions. However, there may be a case that due to interference of the magnetic fields, the magnetic field of a desired intensity cannot be supplied to a selected memory cell and the data cannot be written accurately.

The prior art literature 1 does not consider the problem of erroneous writing caused by the magnetic noise on an adjacent memory cell and magnetic field interference at the time of parallel writing of multi-bit data at all.

SUMMARY OF THE INVENTION

An object of the present invention is to provide a semiconductor memory device capable of reducing magnetic noise, or magnetic field disturbance in writing data.

A semiconductor memory device according to a first aspect of the present invention includes: a plurality of memory cells arranged in rows and columns; a plurality of bit lines disposed in correspondence to memory cell columns and each connecting to memory cells of a corresponding column; and a plurality of bit line drive circuits disposed in correspondence to the bit lines, each for supplying current according to write data to a corresponding bit line. Each of the bit line drive circuits includes a first drive circuit for supplying a first current to a corresponding bit line in accordance with write data to an adjacent column when the adjacent column is selected, and a second drive circuit for supplying a second current to a corresponding bit line in accordance with write data to a corresponding column when the corresponding column is selected.

A semiconductor memory device according to a second aspect of the present invention includes: a plurality of magnetic memory cells arranged in rows and columns; a plurality of bit lines disposed in correspondence to the columns of the plurality of magnetic memory cells, each connecting to memory cells of a corresponding column; a column selecting circuit for selecting a predetermined number of memory cell columns in parallel from the plurality of magnetic memory cell columns in accordance with an address signal, at least one bit line being arranged between each adjacent column pair in the predetermined number of memory cell columns; and a plurality of bit line drive circuits disposed in correspondence to the bit lines, each for supplying a current to a corresponding bit line in accordance with write data and a column selection signal from the column selecting circuit. The column selecting circuit selects the predetermined number of memory cell columns such that at least one bit line is arranged between adjacent columns in the predetermined number of columns.

In the bit line drive circuit, by supplying a first current to a corresponding bit line in accordance with write data to an adjacent column when the adjacent column is selected. Even in the case where data is written simultaneously to one or a plurality of adjacent columns, the current can be conducted so as to cancel out magnetic field interference. Thus, data can be written accurately.

In writing data of a plurality of bits, by selecting bit lines with at least one bit line being sandwiched between any adjacent selected bit lines, intensity failure of a write magnetic field due to magnetic field interference of write current of a bit line on an adjacent column is not caused. A magnetic field of a desired intensity can be accurately supplied to a selected memory cell and data can be written accurately.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a diagram showing the logic of control signals of the bit line drive circuit shown in FIG. 10 in the form of a truth table;

FIG. 20 is a diagram showing the logic of control signals of the bit line drive circuit shown in FIG. 19 in a truth table form;

FIG. 22 is a diagram showing the logic of control signals of the bit line drive circuit shown in FIG. 21 in a truth table form.

DESCRIPTION OF THE PREFERRED EMBODIMENTS

First Embodiment

Figure 1:
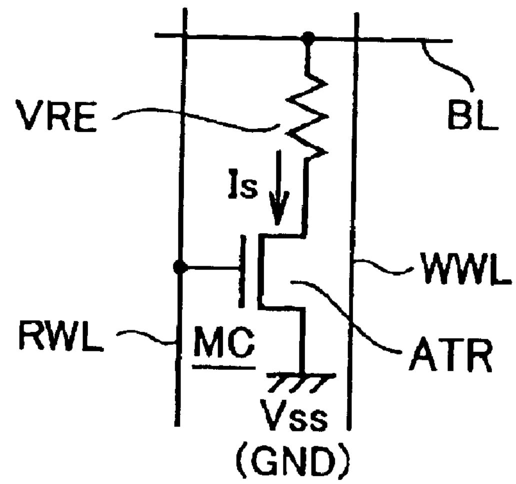
FIG. 1 is a diagram showing an electric equivalent circuit of a memory cell according to the present invention.

FIG. 1 is a diagram schematically showing the configuration of a memory cell used in the present invention. In FIG. 1, a memory cell MC includes a variable magneto-resistance element VRE having a magnetic resistance changed according to storage data and an access element ATR for forming a path of a data read current Is passing through variable magneto-resistance element VRE in reading data. Access transistor ATR typically takes the form of a field effect transistor. In FIG. 1, access element ATR is formed of an MIS transistor (insulated gate field effect transistor).

Variable magneto-resistance element VRE is formed of a tunneling magneto-resistance element having a magnetic tunnel junction, that is, a TMR element.

Variable magneto-resistance element VRE is connected to a bit line BL at one end thereof and is connected to access element ATR at the other end thereof Access transistor ATR is selectively made conductive in response to a signal potential on a read word line RWL and, when made conductive, connects the other end of variable magneto-resistance element VRE to a fixed potential Vss (for example, ground voltage GND).

A write word line WWL is further provided to the memory cell MC. At the time of writing data, current is supplied in a predetermined direction to write word line WWL. At the time of reading data, read word line RWL is driven to a selected state. To bit line BL, an electric signal (current) corresponding to the data stored in memory cell MC is transmitted at the time of writing and reading data.

Figure 2:
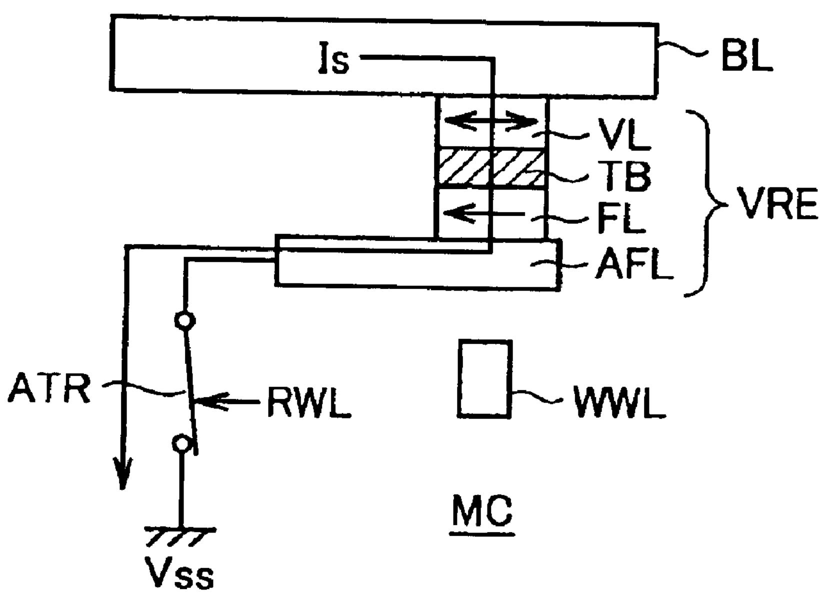
FIG. 2 is a diagram schematically showing a current path in reading data in a memory cell according to the present invention.

FIG. 2 is a diagram schematically showing a sectional structure of variable magneto-resistance element VRE shown in FIG. 1. In FIG. 2, variable magneto-resistance element VRE includes: a fixed magnetic layer FL having a fixed predetermined magnetization direction; a free magnetic layer VL magnetized in the direction according to a magnetic field applied externally; a tunnel insulating film TB disposed between fixed magnetic layer FL and free magnetic layer VL; and a local line AFL for connecting fixed magnetic layer FL to access element ATR. Below local line AFL, a write word line WWL is disposed.

Each of fixed magnetic layer FL and free magnetic layer VL is formed by a ferromagnetic layer. The magnetization direction of free magnetic layer VL is set in the same or opposite direction as or to that of fixed magnetic layer FL in accordance with the logic level of write data. A magnetic tunnel junction is formed by fixed magnetic layer FL, tunnel insulating film TB, and free magnetic layer VL.

At the time of reading data, read word line RWL is driven to a selected state and access element ATR is set in a conductive state. When access element ATR is made conductive, local line AFL is connected to the fixed potential node and data read current Is can be caused to flow through the path of bit line BL, variable magneto-resistance element VRE, and the fixed potential node.

Electrical resistance of variable magneto-resistance element VRE changes according to the relationship between the magnetization directions of fixed magnetic layer FL and free magnetic layer VL. Specifically, when the magnetization direction (the direction to the left in FIG. 2) of fixed magnetic layer FL is the same parallel) as that of free magnetic layer VL, the electrical resistance of variable magneto-resistance element VRE is lower, as compared with the case where the magnetization directions of fixed magnetic layer FL is opposite (anti-parallel) to free magnetic layer VL.

Therefore, when free magnetic layer VL is magnetized in the direction according to storage data and data read current Is is caused to flow, an amount of current flowing in variable magneto-resistance element VRE varies according to storage data. Therefore, for example, after bit line BL is precharged to a predetermined voltage, when data read current Is is caused to flow from bit line BL to variable magneto-resistance element VRE, the voltage of bit line BL changes according to the amount of current flowing through variable magneto-resistance element VRE. By detecting the voltage of bit line BL, the data stored in the memory cell can be read. Write word line WWL is not used in reading data.

Figure 3:
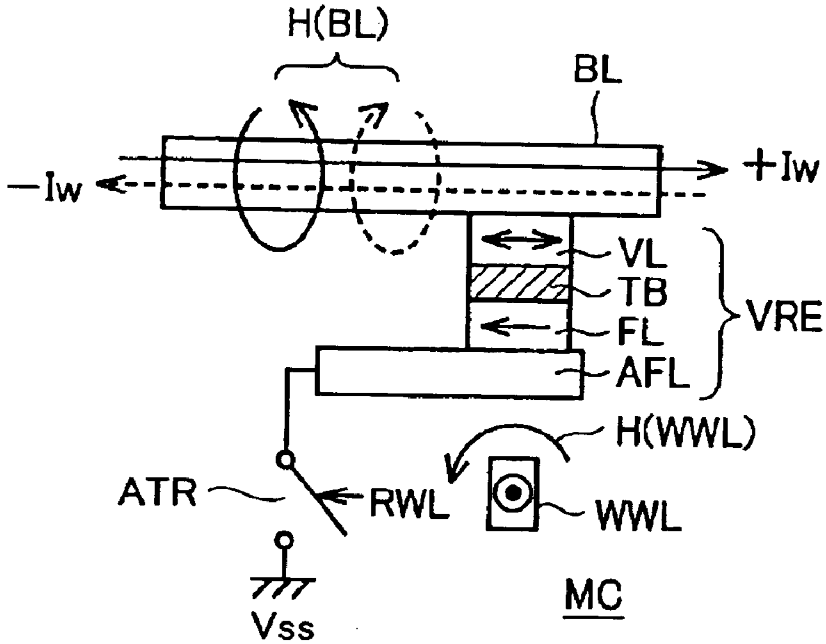
FIG. 3 is a diagram schematically showing an induced magnetic field in writing data of a memory cell according to the present invention.

FIG. 3 is a diagram schematically showing an induced magnetic field at the time of writing data to memory cell MC. The configuration of memory cell MC is the same as that of memory cell MC in FIG. 2. The corresponding part is designated by the same reference numeral and its detailed description will not be repeated.

At the time of writing data, read word line RWL is maintained in a non-selected state and, accordingly, access element ATR is maintained in a nonconductive state. A current in a predetermined direction is supplied to write word line WWL and a write word line magnetic field H(WWL) is generated. By the current flowing in write word line WWL, as an example, in FIG. 3, a magnetic field which rotates counterclockwise in the plane orthogonal to write word line WWL is generated as write word line magnetic field H(WWL).

On the other hand, a current +Iw or −Iw flows through bit line BL in accordance with write data. In the case where current +Iw flows in the right direction in the figure, in a plane orthogonal to the flowing direction of current +Iw, as shown by a solid line in the figure, a magnetic field H(BL) rotating clockwise is induced. On the other hand, in the case where current −Iw flows in the left direction as shown by a broken line, magnetic field H(BL) rotating counterclockwise is induced with bit line BL being a center. By a combined magnetic field of magnetic fields H(WWL) and H(BL), the magnetization direction of free magnetic layer VL is determined.

Figure 4:
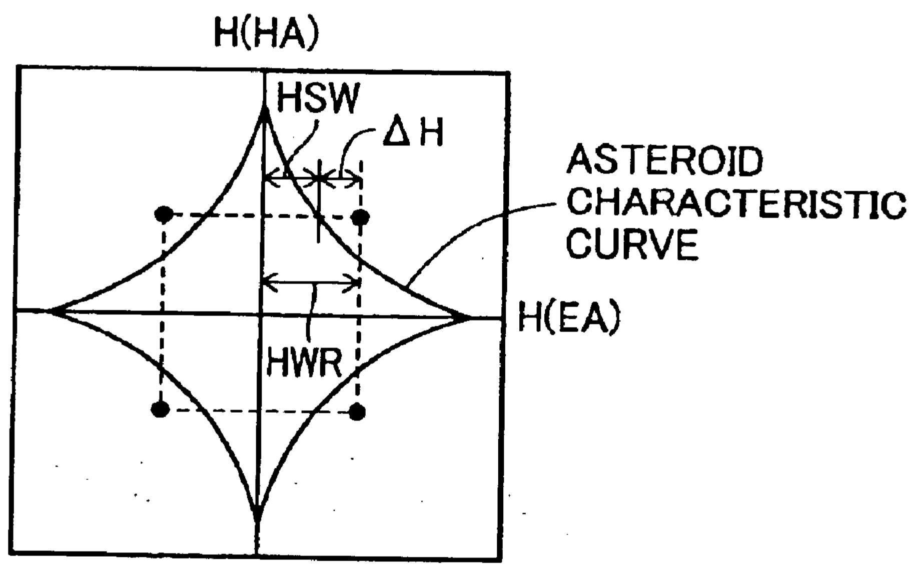
FIG. 4 is a diagram showing magnetic characteristics of the memory cell according to the present invention.

FIG. 4 is a diagram for describing a magnetization state of the variable magneto-resistance element at the time of writing data. In FIG. 4, the horizontal axis H(EA) indicates a magnetic field applied in easily magnetized axis (an easy axis EA) direction in free magnetic layer VL of variable magneto-resistance element VRE. A vertical axis H(HA) indicates a magnetic field acting in a hardly magnetization axis (a hard axis HA) direction in free magnetic layer VL. Magnetic fields H(EA) and H(HA) each correspond to one of two magnetic fields H(WWL) and H(BL) induced by currents flowing in bit line BL and write word line WWL, respectively.

In memory cell MC, the fixed magnetization direction of fixed magnetic layer FL corresponds to the easy axis EA. On the other hand, free magnetic layer VL is magnetized in the direction parallel to (the same direction as) or anti-parallel (opposite) to the magnetization direction of fixed magnetic layer FL along the easy axis direction in accordance with the logic level ("1" or "0") of storage data. Electric resistance values of variable magneto-resistance element VRE corresponding to the two kinds of magnetization directions of the free magnetic layer VL are expressed as R1 and R0 (R1>R0). This memory cell MC can store data of one bit ("1" or "0") in correspondence to the magnetization directions of the two kinds of free magnetic layer VL.

Operation points of a memory cell, that is, combined magnetic fields applied to variable magneto-resistance element VRE are marked by painted circle signs in FIG. 4. The direction of the write current flowing through write word line WWL is constant and therefore, the operation points of the combined magnetic field applied to variable magneto-resistance element VRE of the memory cell are two points on the upper or lower side of the easy axis H(EA).

At the time of writing data, in the case where the combined magnetic field of the magnetic fields H(EA) and H(HA) reaches a region outside of the asteroid characteristic curve shown in FIG. 4, the magnetization direction of free magnetic layer VL can be determined. In the case where the combined magnetic field of magnetic fields H(EA) and H(HA), that is, the combined magnetic field of bit line write magnetic field H(BL) and write word line magnetic field H(WWL) has an intensity corresponding to the region on the inside of the asteroid characteristic curve, the magnetization direction of free magnetic layer VL does not change. By applying a magnetic field along the hard axis to free magnetic layer VL, a magnetization threshold necessary to change the magnetization direction along easy axis EA can be reduced.

In the case where the asteroid characteristic curve and operation points as shown in FIG. 4 are set, the value of data write current flowing in bit line BL and/or write word line WWL is designed such that the data write magnetic field intensity in the easy axis direction in a memory cell to which data is to be written becomes HWR. Generally, data write magnetic field intensity HWR is represented by the sum of a switching magnetic field HSW necessary to switch the magnetization direction of the free magnetic layer and a margin ΔH. That is, the relation of HWR=HSW+ΔH is satisfied.

Therefore, in order to rewrite storage data in a memory cell, that is, the magnetization direction of the free magnetic layer of variable magneto-resistance element VRE, a data write current of a predetermined level or higher is required to flow through write word line WWL and bit line BL. By a combined magnetic field of magnetic fields H(BL) and H(WWL) induced by the data write current flowing in write word line WWL and bit line BL, free magnetic layer VL of variable magneto-resistance element VRE is magnetized in the direction the same as (parallel to) or opposite to (anti-parallel to) the magnetization direction of fixed magnetic layer FL. Usually, a current is caused to flow to write word line WWL such that write word line magnetic field H(WWL) makes the magnetic field H(HA) in the hard axis direction.

Figure 5:
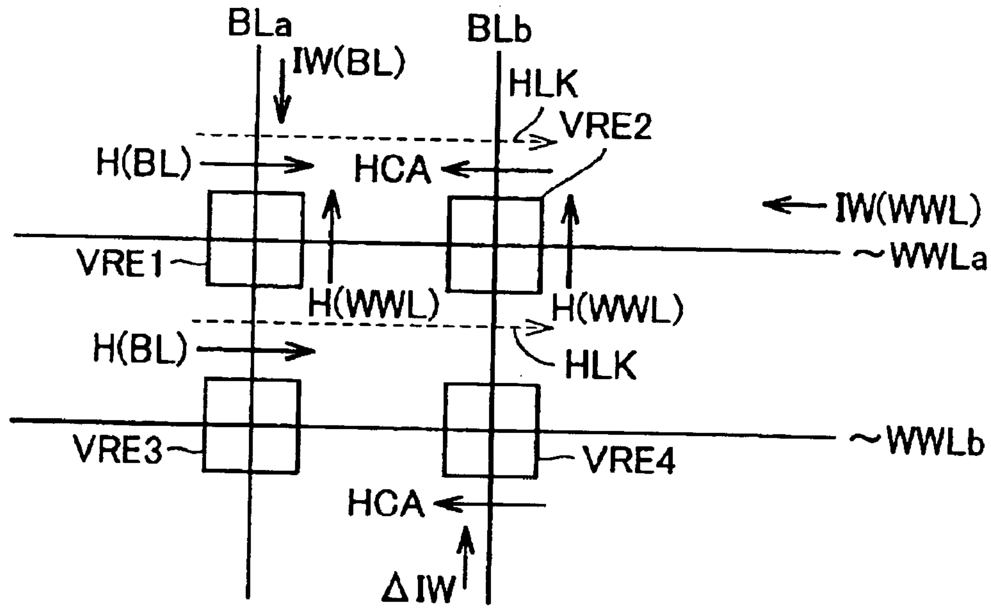
FIG. 5 is a diagram schematically showing a bit line current and an induced magnetic field of a semiconductor memory device according to an embodiment of the present invention.

FIG. 5 is a diagram showing a conceptual configuration of the first embodiment of the present invention. In FIG. 5, write word lines WWLa and WWLb and bit lines BLa and BLb are shown. Variable resistive elements VRE1 and VRE2 of memory cells are disposed corresponding to crossings between write word line WWLa and bit lines BLa and BLb. Variable resistive elements VRE3 and VRE4 are disposed corresponding to crossings between write word line WWLb and bit lines BLa and BLb.

It is now assumed that a write current IW(WWL) flows from the right to left direction in the figure, and a data write current IW(BL) flows from the top to bottom direction in the figure. A magnetic field is induced onto bit line BLa by data write current IW(BL), and write magnetic field H(BL) in the word line direction is applied to variable resistive element VRE1. Similarly, a magnetic field is generated by data write current IW(WWL) of write word line WWLa, and magnetic field H(WWL) in the bit line direction is applied to variable resistive element VRE1. A combined magnetic field of magnetic fields H(BL) and H(WWL) determines the magnetization direction of the free magnetic layer of variable resistive element VRE1.

To variable resistive element VRE2 of a memory cell adjacent to variable resistive element VRE1, similarly, magnetic field H(WWL) is applied by write current IW(WWL) flowing in write word line WWLa. To variable resistive element VRE2, a leakage magnetic field HLK is applied by data write current IW(BL) flowing in bit line BLa. In case that the combined magnetic field of leakage magnetic field HLK and induced magnetic field H(WWL) of the write word line extends beyond the asteroid characteristic curve shown in FIG. 4, there is the possibility that the magnetization direction of variable resistive element VRE2 is rewritten. Particularly, when memory cells are disposed in high density and the interval between bit lines BLa and BLb is narrowed, the intensity of leakage magnetic field HLK becomes high and magnetic disturbance in which the magnetization direction of variable resistive element VRE2 occurs. To cancel out the influence of leakage magnetic field HLK, a cancel current ΔIW is supplied to bit line BLb in the direction opposite to the direction of data write current IW(BL) flowing in selected bit line BLa. By cancel current ΔIW, a magnetic field HCA is generated in the direction of canceling out leakage magnetic field HLK, an influence of leakage magnetic field HLK can be canceled out, and rewriting of the magnetization direction in variable resistive element VRE2 can be prevented.

The magnitude of cancel current ΔIW is about 10 to 30% a current. amount of data write current IW(BL) and is set to the magnitude allowing the combined magnetic field of magnetic fields H(WL), HLK, and HCA to lie in the asteroid characteristic curve shown in FIG. 4.

When cancel current ΔIW flows in bit line BLb, cancel magnetic field HCA is applied also to variable resistive elements VRE3 and VRE4 connected to write word line WWLb. However, write word line WWLb is not in the selected state and cancel magnetic field HCA cancels out leakage magnetic field HLK generated from bit line BLa. Thus, no change occurs in the magnetization direction in variable resistive elements VRE3 and VRE4.

Specifically, a small cancel current is caused to flow in the direction opposite to data write current to a non-selected bit line adjacent to a selected bit line to cancel the leakage magnetic field. The magnetic disturbance is therefore eliminated and data can be written only into a selected memory cell with reliability.

Figure 6:
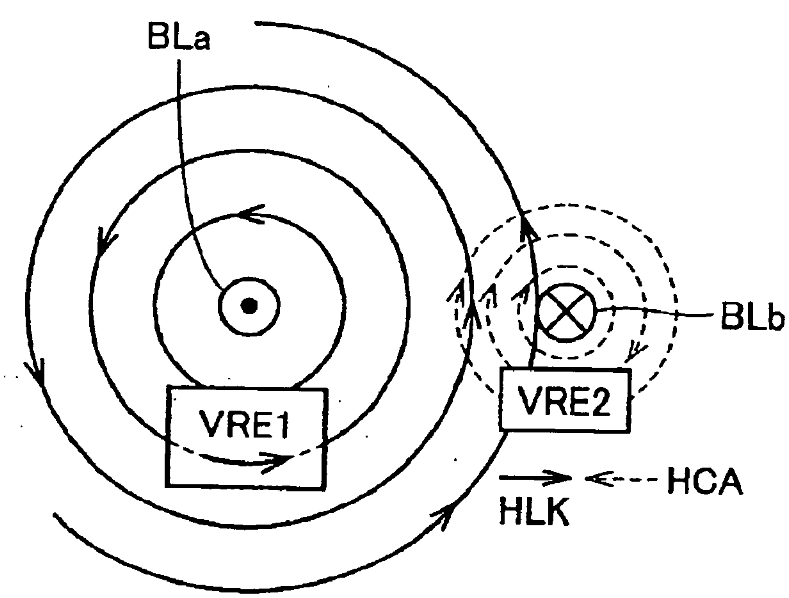
FIG. 6 is a diagram schematically showing a leakage magnetic field and a cancel magnetic field in the first embodiment of the present invention.

FIG. 6 is a diagram schematically showing induced magnetic fields by bit lines BLa and BLb. By the data write current flowing in bit line BLa, the magnetic field in the counterclockwise direction in FIG. 6 is induced around bit line BLa. By the induced magnetic field by the data write current in bit line BLa, the magnetization direction in variable resistive element VRE1 is set. By the magnetic field induced by bit line BLa, leakage magnetic field HLK is similarly applied also to variable resistive element VRE2 in an adjacent column. Leakage magnetic field HLK causes the magnetization in a clockwise direction in FIG. 6 to occur in variable resistive element VRE2. In this state, a cancel current is applied to bit line BLb in the direction opposite to the data write current flowing in bit line BLa to generate a clockwise magnetic field around bit line BLb. The cancel magnetic field induced by bit line BLb is a magnetic field which promotes magnetization in a counterclockwise direction in variable resistive element VRE2. Therefore, an influence of cancel magnetic field HCA and leakage magnetic field HLK is canceled out in variable resistive element VRE2, a combined magnetic field applied to variable resistive element VRE2 lies in the asteroid characteristic curve shown in FIG. 4, and the magnetization direction of variable resistive element VRE2 does not change.

To resolve the magnetic field disturbance by cancel magnetic field HCA, it is sufficient that an influence of leakage magnetic field HLK is canceled out in variable resistive element VRE2 and a combined magnetic field in non-selected variable resistive element VRE2 in the adjacent column exists inside the asteroid characteristic curve shown in FIG. 4. Cancel magnetic field HCA induced by the cancel current flowing in adjacent bit line BLb is sufficiently smaller than the write magnetic field induced by the data write current. Therefore, even when cancel magnetic field HCA is more intensive than leakage magnetic field HLK, no change occurs in the magnetization direction in variable resistive element VRE2.

That is, according to the first embodiment, a cancel current smaller than the data write current flowing in a selected bit line is caused to flow to a bit line adjacent to the bit line on a selected column in the direction opposite to the direction of the data write current, thereby canceling out the leakage magnetic field from the selected bit line.

Figure 7:
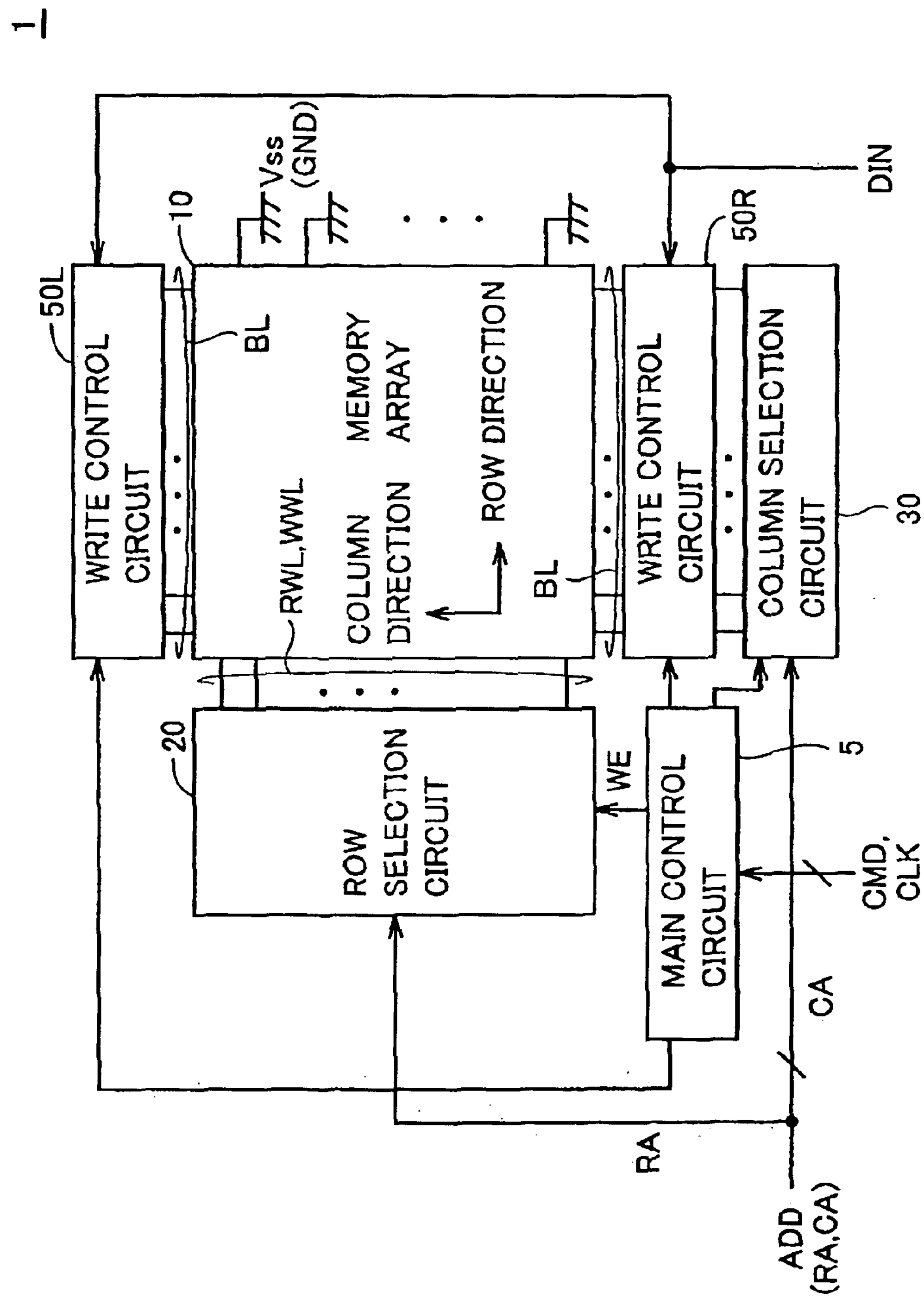
FIG. 7 is a diagram schematically showing an entire configuration of a semiconductor memory device according to the present invention.

FIG. 7 is a diagram schematically showing an entire configuration of the semiconductor memory device according to the first embodiment of the present invention. A semiconductor memory device 1 executes an operation of inputting and outputting write data DIN and read data in accordance with a control signal (command) CMD and an address signal ADD. In FIG. 7, the configuration of a part related to data writing is shown, but the configuration of a part related to data reading is not shown. The data writing and reading operations in semiconductor memory device 1 are executed synchronously with a clock signal CLK supplied externally. However, in semiconductor memory device 1, an operation timing may be determined internally by a main control circuit 5.

Semiconductor memory device 1 includes the main control circuit 5 for controlling overall operations of semiconductor memory device 1 in accordance with control signal (command) CMD and a memory array 10 having a plurality of memory cells arranged in rows and columns. Read word lines RWL and write word lines WWL are disposed in correspondence to memory cell rows of memory array 10. Bit lines BL are disposed in correspondence to memory cell columns.

An end of each of write word line WWL and read word line RWL is coupled to a fixed potential Vss (ground voltage GND).

Semiconductor memory device 1 further includes: a row selection circuit 20 for driving write word line WWL or read word line RWL corresponding to a selected row in memory array 10 to a selected state in accordance with a row address signal RA included in address signal ADD under control of main control circuit 5; a column selection circuit 30 for decoding a column address signal CA included in address signal ADD to generate a column selection signal under control of main control circuit 5; and write control circuits 50R and 50L for supplying a write data current and a cancel current to bit line BL at the time of writing data. In write control circuits 50R and 50L, bit line drivers are provided in correspondence to bit lines BL such that the data write current and cancel current can be supplied to bit lines BL in both directions.

Although a sense amplifier for reading data and a read control circuit for supplying a read current are provided adjacent to write control circuits 50R and 50L, in FIG. 7, the configuration of a part related to the data reading operation is not shown as described above.

Figure 8:
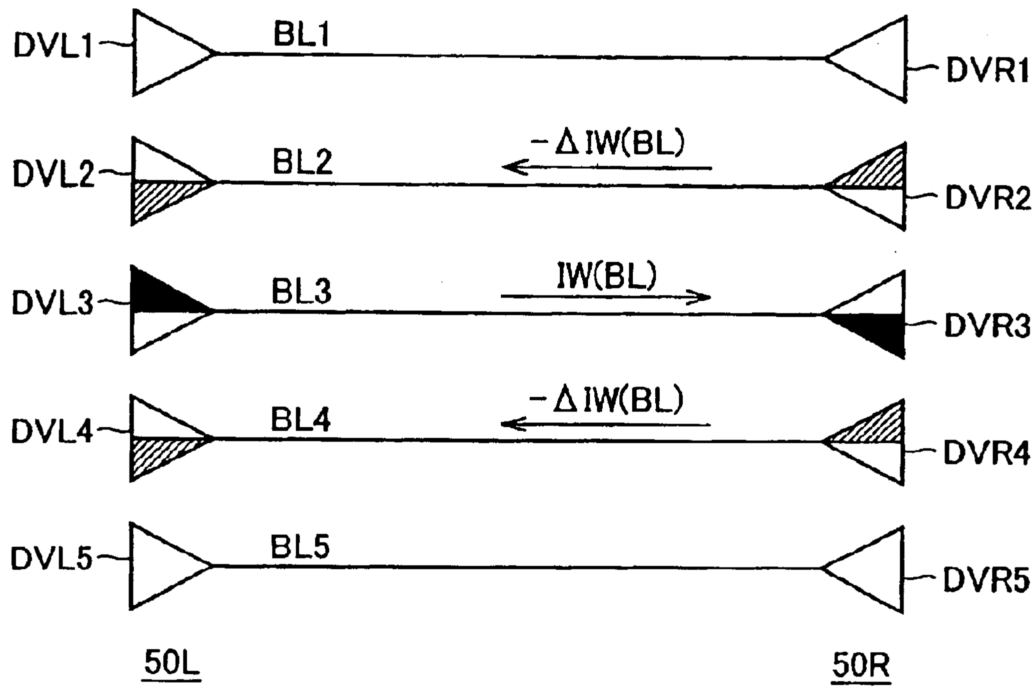
FIG. 8 is a diagram schematically showing the configuration of main portion and an operation of the semiconductor memory device according to the first embodiment of the present invention.

FIG. 8 is a diagram schematically showing the configuration and operation of write control circuits 50R and 50L shown in FIG. 7. In FIG. 8, bit lines BL1 to BL5 are representatively shown. Write control circuit 50L includes bit line current drivers DVL1 to DVL5 provided in correspondence to bit lines BL1 to BL5, respectively. Write control circuit 50R includes bit line current drivers DVR1 to DVR5 provided in correspondence to bit lines BL1 to BL5, respectively. Each of bit line current drivers DVL1 to DVL5 and DVR1 to DVR5 selectively charges or discharges a corresponding bit line in accordance with write data and a column selection signal.

It is assumed now that bit line BL3 is selected, bit line current driver DVL3 supplies current to bit line BL3, and bit line current driver DVR3 discharges bit line BL3. In this state, data write current IW(BL) flows from bit line current driver DVL3 to bit line current driver DVR3. At this time, in bit line L2, cancel current −ΔIW(BL) flows from bit line current driver DVR2 to bit line current driver DVL2. In bit line BL4, cancel current −ΔIW(BL) flows from bit line current driver DVR4 to bit line current driver DVL4.

By flowing cancel current −ΔIW(BL) in the direction opposite to data write current IW(BL) flowing in selected bit line BL3 in bit lines BL2 and BL4 adjacent to selected bit line BL3, an influence of a magnetic field induced by data write current IW(BL) onto memory cells connected to bit lines BL2 and BL4 can be canceled out by the magnetic field induced by the cancel current. Thus, erroneous writing caused by magnetic field interference can be prevented at the time of writing data, and a highly reliable semiconductor memory device can be implemented.

Figure 9:
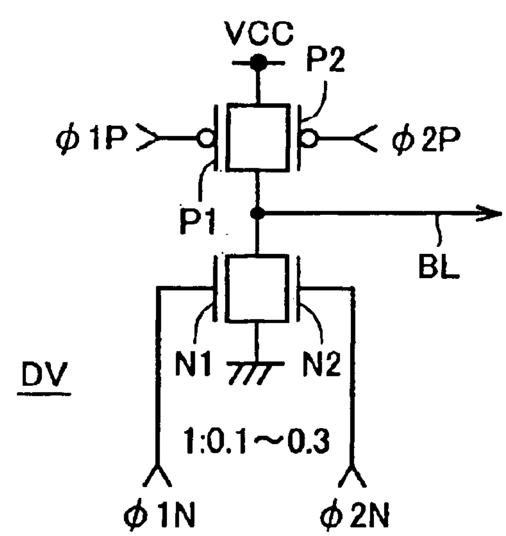
FIG. 9 is a diagram showing an example of the configuration of a bit line current driver shown in FIG. 8.

FIG. 9 is a diagram showing an example of the configuration of a bit line current driver. Since bit line current drivers DVL1 to DVL5 and DVR1 to DVR5 shown in FIG. 8 have the same configuration, in FIG. 9, one bit line current driver DV is representatively shown.

In FIG. 9, bit line current driver DV includes: P-channel MIS transistors (insulated gate field effect transistors) P1 and P2 connected in parallel between the power supply node and bit line BL and receiving control signals ϕ1P and ϕ2P at their respective gates; and N-channel MIS transistors N1 and N2 connected in parallel between bit line BL and the ground node and receiving control signals ϕ1N and ϕ2N at their respective gates.

By MIS transistors P1 and N1, data write current IW(BL) to bit line BL is driven. By MIS transistors P2 and N2, cancel current −ΔIW(BL) is driven. Therefore, MIS transistors P2 and N2 are made smaller in size (the ratio of channel width to channel length, W/L) than MIS transistors P1 and N1. By such size adjustment, a cancel current of a magnitude of 10 to 30% of data write current IW(BL) can be supplied.

When bit line BL is selected and the data write current is supplied to bit line BL, one of MIS transistors P1 and N1 is turned on in accordance with control signals ϕ1P and ϕ1N, and bit line BL is charged or discharged. In this case, the bit line current driver provided at the opposite end of bit line BL operates complementarily, and charging or discharging of current to bit line BL is executed. At the time of supplying the data write current to bit line BL, both MIS transistors P2 and N2 are in an off state.

In the case where a bit line adjacent to bit line BL is selected, one of MIS transistors N2 and P2 is made conductive according to control signals ϕ2N and ϕ2P to charge or discharge bit line BL. At this time, the bit line current driver provided at the opposite end of bit line BL operates complementarily to discharge or charge bit line BL, and a cancel current flows in bit line BL.

When the cancel current is to flow through bit line BL, MIS transistors P1 and N1 are in the off state.

Figure 10:
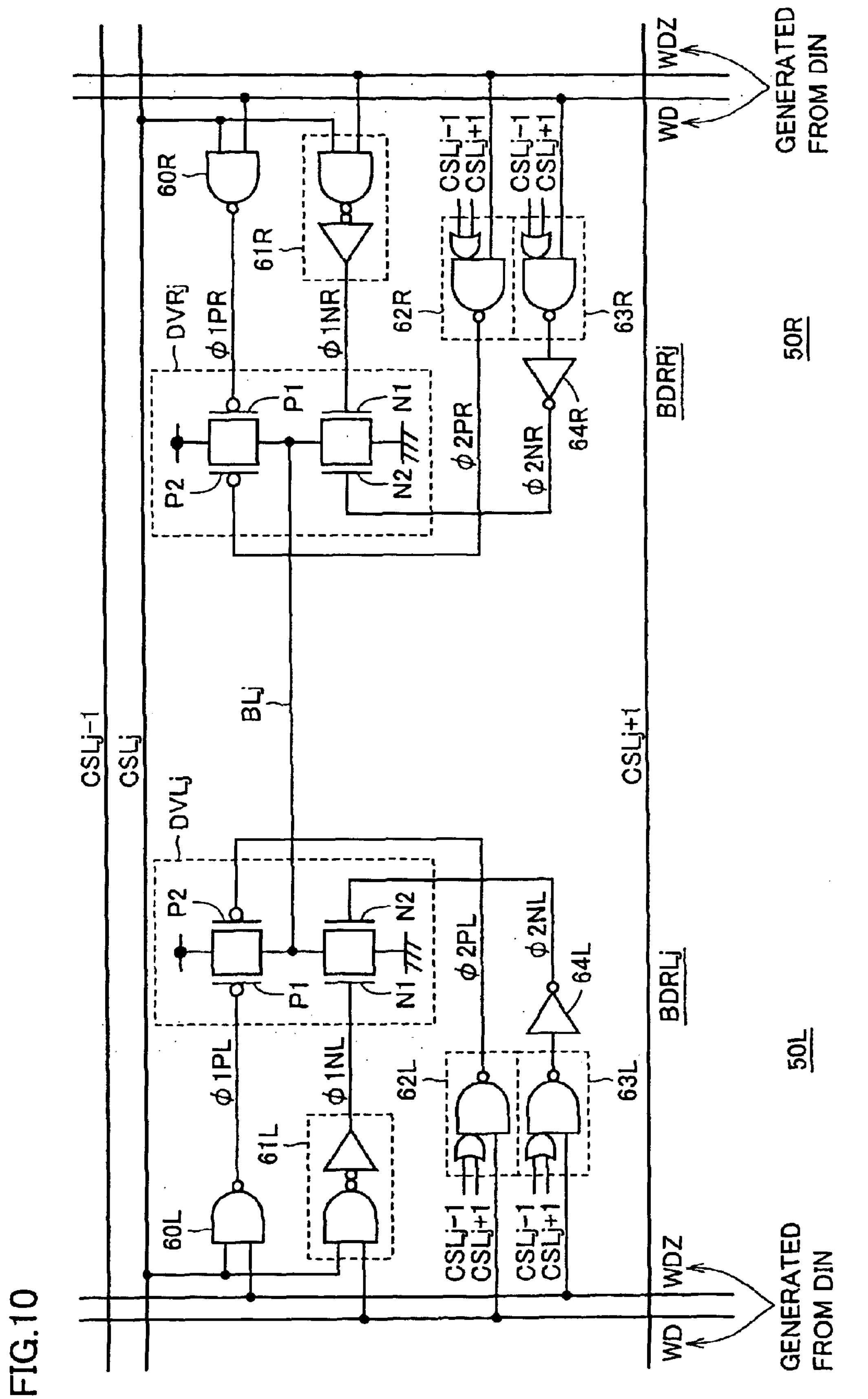
FIG. 10 is a diagram showing an example of the configuration of a bit line drive circuit according to the first embodiment of the present invention.

FIG. 10 is a diagram more specifically showing the configuration of write control circuits 50L and 50R. In FIG. 10, the configuration of a bit line drive circuit provided for a bit line BLj is representatively shown.

In FIG. 10, a bit line drive circuit BDRLj included in write control circuit 50L includes: an NAND circuit 60L receiving a column selection signal CSLj and complementary write data WDZ and generating a control signal ϕ1PL; an AND circuit 61L receiving column selection signal CSLj and internal write data WD and generating a control signal ϕ1NL; a composite gate circuit 62L for receiving column selection signal CSLj−1 and CSLj+1 and internal write data WD and generating a control signal ϕ2PL; a composite gate circuit 63L receiving column selection signals CSLj−1 and CSLj+1 and complementary internal write data WDZ; an inverting circuit 64L inverting an output signal of composite gate circuit 63L and generating a control signal ϕ2NL; and a bit line current driver DVLj for driving bit line BLj in accordance with control signals ϕ1PL, ϕ1NL, ϕ2PL, and ϕ2NL.

When bit line BLj is selected, column selection signal CSLj is driven to a selected state (H level). When adjacent bit lines BLj−1 and BLj+1 are selected, column selection signals CSLj−1 and CSLj+1 are driven to a selected state, respectively. These column selection signals are generated from column selection circuit 30 shown in FIG. 7.

Internal write data WD and WDZ are complementary internal write data generated from input data DIN shown in FIG. 7. Alternatively, internal write data WD and WDZ may be generated by a write driver which is activated in response to activation of write enable signal WE or may be generated by simply buffering write data DIN.

Composite gate circuit 62L equivalently includes an OR gate receiving column selection signals CSLj−1 and CSLj+1, and an NAND gate receiving an output signal of the OR gate and internal write data WD. Composite gate circuit 63L equivalently includes an OR gate receiving column selection signals CSLj−1 and CSLj+1 and an NAND gate receiving an output signal of the OR gate and complementary internal write data WDZ.

Bit line current driver DVLj has a configuration similar to that of bit line current driver DV shown in FIG. 9. The same reference numerals are allotted to corresponding parts and detailed description thereof will not be repeated. Control signals ϕ1PL and ϕ2PL are supplied to the gates of MIS transistors P1 and P2, respectively, and control signals ϕ1NL and ϕ2NL are supplied to the gates of MIS transistors N1 and N2, respectively.

A bit line drive circuit BDRRj included in write control circuit 50R includes: an NAND circuit 60R receiving a column selection signal CSLj and internal write data WD and generating a control signal ϕ1PR; an AND circuit 61R receiving column selection signal CSLj and complementary internal write data WDZ and generating a control signal ϕ1NR; a composite gate circuit 62R receiving column selection signal CSLj−1 and CSLj+1 and complementary internal write data WDZ and generating a control signal ϕ2PR; a composite gate circuit 63R receiving column selection signals CSLj−1 and CSLj+1 and write data WD and generating a control signal ϕ2PR; an inverting circuit 64R inverting an output signal of composite gate circuit 63R and generating a control signal 42NR; and a bit line current driver DVRj for driving bit line BLj in accordance with control signals ϕ1PR, ϕ1NR, ϕ2PR, and ϕ2NR.

Composite gate circuit 62R equivalently includes an OR gate receiving column selection signals CSLj−1 and CSLj+1, and an NAND gate receiving an output signal of the OR gate and complementary internal write data WDZ. Composite gate circuit 63R equivalently includes an OR gate receiving column selection signals CSLj−1 and CSLj+1 and an NAND gate receiving an output signal of the OR gate and internal write data WD.

Bit line drive circuit BDRRj included in write control circuit 50R is the same as bit line drive circuit BDRLj provided in write control circuit 50L, except for that internal write data WD and WDZ are interchanged. Therefore, bit line drive circuits BDRLj and BDRRj operate complementarily and drive bit line currents in opposite directions.

By disposing MIS transistors P2 and N2 for generating cancel current at both sides of a bit line, the cancel current can be accurately supplied to a corresponding to bit line in the direction according to the write data of the adjacent bit lines.

FIG. 11 is a diagram showing, in a list form, logic levels of the control signals shown in FIG. 10. With reference to FIG. 11, the operation of bit line drive circuits BDRLj and BDRRj shown in FIG. 10 will be described below.

(1) When all of column selection signals CSLj−1, CSLj, and CSLj+1 are in the unselected state, control signals ϕ1PL and ϕ1PR from NAND circuits 60L and 60R are at a logical high, or H level and control signals ϕ1NL and ϕ1NR from AND circuits 61L and 61R are at a logical low, or L level. Both control signals ϕ2PL and 2ϕPR from composite gates 62L and 62R are at H level, and output signals from composite gates 63L and 63R are at H level. Accordingly, control signals ϕ2NL and ϕ2NR from inverting circuits 64L and 64R are at L level. Therefore, in bit line current drivers DVLj and DVRj, all of MIS transistors P1, P2, N1, and N2 are in an off state.

(2) Next, the case where bit line BLj is selected will be considered. When internal write data WD is at H level and data "0" is written, complementary internal write data WDZ is at L level. Therefore, control signal ϕ1PL from NAND circuit 60L is at H level, and control signal ϕ1NL from AND circuit 61L attains H level. Since both column selection signals CSLj−1 and CSLj+1 are at L level, control signals ϕ2PL and ϕ2NL attain H level and L level, respectively, and are in an inactive state. Therefore, in bit line current driver DVLj, MIS transistor N1 is made conductive and all of the remaining MIS transistors P2, P1, and N2 are in an off state.

In bit line drive circuit BDRRj of write control circuit 50R, similarly, column selection signals CSLj−1 and CSLj+1 are at L level, so that control signals ϕ2PR and ϕ2NR attain the H and L levels, respectively. NAND circuit 60R receives internal write data WD, and control signal ϕ1PR attain L level. Control signal ϕ1NR from AND circuit 61R attain L level in accordance with complementary internal write data WDZ. Therefore, in bit line current driver DVRj, MIS transistor P1 is in the on state and the remaining MIS transistors P2, N2, and N1 are in the off state.

Therefore, in the case of causing the "0" data write current to flow in bit line BLj, the current flows from MIS transistor P1 of bit line current driver DVRj to MIS transistor N1 of bit line current driver DVLj via bit line BLj.

(3) Upon selection of bit line BLj, when write data WD is at L level. and writing "1" is performed, complementary internal write data WDZ is at L level, and control signals ϕ1PL and ϕ1NL attain L level, and both control signals ϕ1PR and ϕ1NR attain H level. Since adjacent columns are in a non-selected state, all of control signals ϕ2PL, ϕ2PR, ϕ2NL, and ϕ2NR are in the non-selected state. Therefore, when internal write data WD is at L level and "1" is written, current flows from MIS transistor P1 of bit line current driver DVLj to the ground node via bit line BLj and MIS transistor N1 of bit line current driver DVRj. Therefore, the direction of currents flowing in bit line BLj can be varied according to the H and L levels of internal write data WD and the magnetization direction of the variable resistive element can be set according to storage data.

(4) When adjacent bit lines are selected, one of column selection signals CSLj+1 and CSLj−1 is driven to H level, and column selection signal CSLj is maintained at L level. Therefore, when an adjacent bit line is selected, both control signals ϕ1PL and ϕ1PR from NAND circuits 60L and 60R attain H level, both control signals ϕ1NL and ϕ1NR from AND circuits 61L and 61R attain L level, and MIS transistors P1 and N1 in bit line current driver DVLj and DVRj are maintained in an off state.

(i) Upon selection of the adjacent bit line, when internal write data WD is at H level, both control signals ϕ2PL and ϕ2NL attain L level. Both control signals ϕ2PR and ϕ2NR attain H level. Therefore, in bit line current driver DVLj, MIS transistor P2 is turned on and MIS transistor N2 is turned off. In bit line current driver DVRj, MIS transistor P2 is turned off, and MIS transistor N2 is turned on. Therefore, under this state, current flows in the path from MIS transistor P2 of bit line current driver DVLj to MIS transistor N2 of bit line current driver DVLj.

(ii) Upon selection of the adjacent bit line, when internal write data WD is at L level, both control signals ϕ2PL and ϕ2NL attain H level and both control signals ϕ2PR and ϕ2NR attain L level. In this case, therefore MIS transistor P2 in bit line current driver DVRj is turned on and MIS transistor N2 in bit line current driver DVLj is turned on. Therefore, current flows in bit line BLj from bit line current driver DVRj to bit line current driver DVLj.

Thus, when an adjacent bit line is selected, the cancel current can be caused to flow in the direction opposite to the direction of the data write current flowing on a selected adjacent bit line.

By disposing bit line drive circuits BDRLj and BDRRj shown in FIG. 10 in correspondence to each bit line in write control circuits 50L and 50R, both the data write current and the cancel current opposite in direction to the data write current can be caused to flow upon selection of an adjacent bit line.

As described above, according to the first embodiment of the present invention, when an adjacent bit line-is selected, the cancel current is caused to flow in a corresponding bit line so as to cancel out magnetic field interference. By an induced magnetic field by the data write current on a selected adjacent bit line, erroneous writing of data of a memory cell in a corresponding bit line can be prevented reliably. Therefore, even when the bit line data write current and word line data write current fluctuate to increase a write magnetic field for increasing a leakage magnetic field accordingly, magnetic field interference can be suppressed reliably, and an operating margin at the time of writing data can be increased.

Second Embodiment

Figure 12:
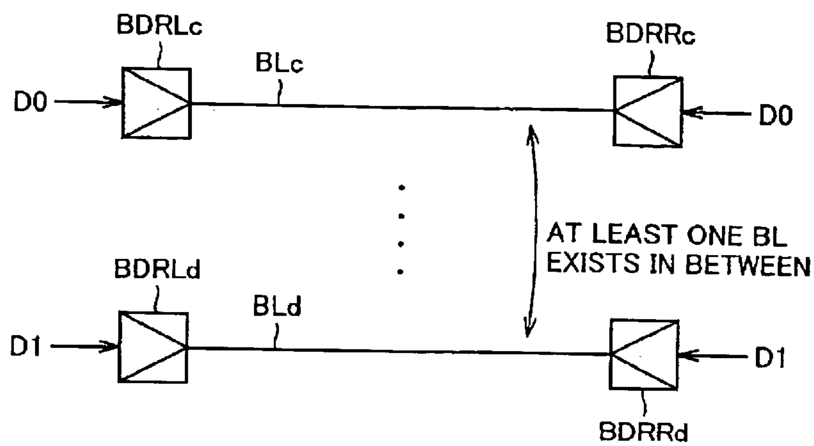
FIG. 12 is a diagram schematically showing an arrangement of selected bit lines in a second embodiment of the present invention.

FIG. 12 is a diagram schematically showing the configuration of a main part of a semiconductor memory device according to a second embodiment of the present invention. In FIG. 12, a plurality of data bits D0 and D1 are written in parallel. As an example, data bit D0 is written to a bit line BLc and data bit D1 is written to bit line BLd. For bit line BLc, bit line drive circuits BDRLc and BDRRc are provided in opposite ends, respectively. For bit line BLd, bit line drive circuits BDRLb and BDRRd are provided in opposite ends, respectively. That is, bit line drive circuits BDRLc and BDRLd are connected to different internal write data lines and bit line drive circuits BDRRc and BDRRd are connected to different internal write data lines.

Between bit lines BLc and BLd, at least one column of memory cells, that is, at least one bit line BL exists.

Upon writing data bits D0 and D1, bit lines BLc and BLd are simultaneously driven. Since at least one bit line BL exists between bit lines BLc and BLd, even when reverse data are transmitted to bit lines BLc and BLd, mutual interference of the magnetic fields induced by bit lines BLc and BLd can be prevented. Therefore, it can be prevented that in writing reverse data, the write magnetic field is canceled out by an interaction between the magnetic fields by the data write currents to cause a write magnetic field failure. Thus, a write magnetic field allowing data to be written in a selected memory cell can be generated, so that data can be written accurately.

Figure 13:
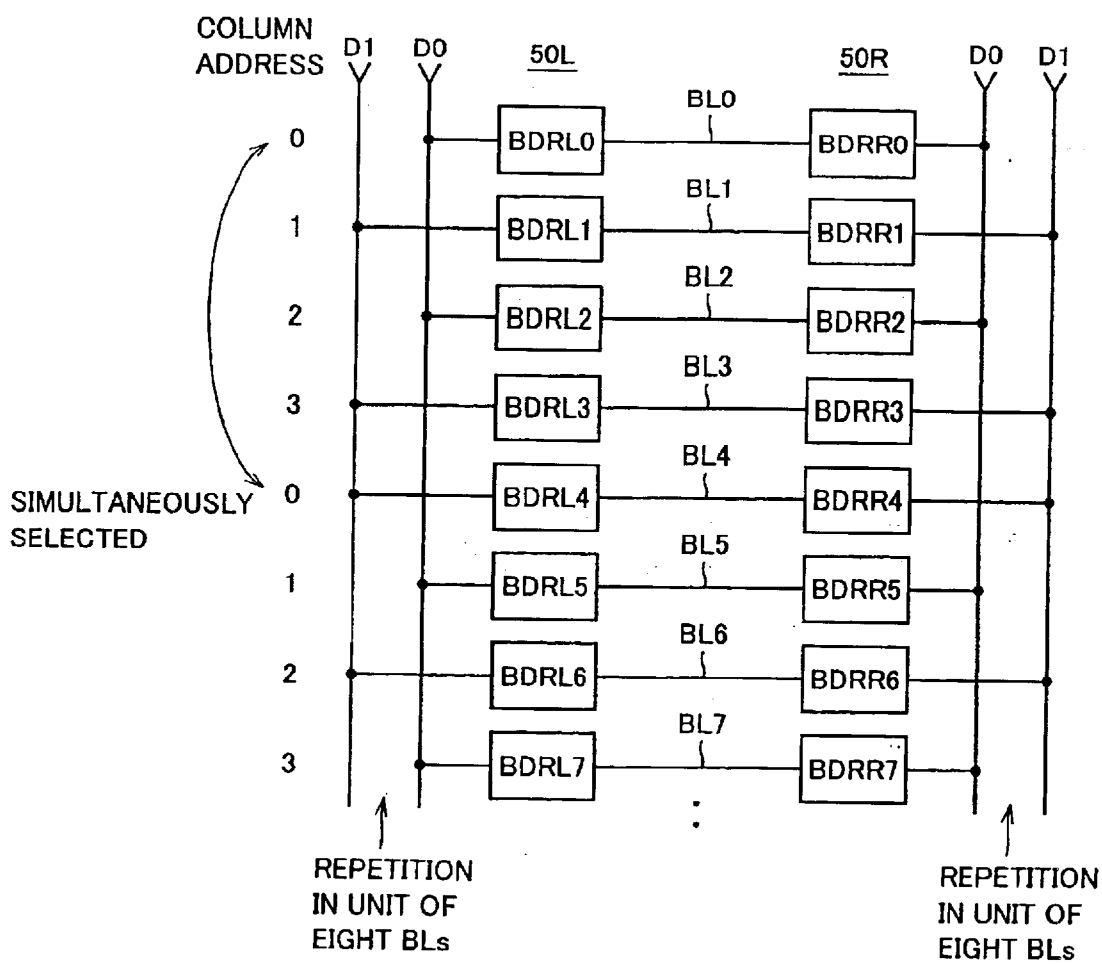
FIG. 13 is a diagram showing an example of correspondence between a bit line and write data in the second embodiment of the present invention.

FIG. 13 is a diagram schematically showing a correspondence between bit lines and internal write data lines. In FIG. 13, bit lines BL0 to BL7 are representatively shown. The figure shows the connection in the case of writing data bits D0 and D1 in parallel.

In FIG. 13, in write control circuit 50L, bit line drive circuits BDRL0 to BDRL7 are provided in correspondence to bit lines BL0 to BL7, respectively. In write control circuit 50R, bit line drive circuits BDRR0 to BDRR7 are provided in correspondence to bit lines BL0 to BL7, respectively. Bit lines BL0 and BL2 are driven in accordance with data bit D1, and bit lines BL1 and BL3 are driven in accordance with data bit D1. On the other hand, bit lines BL4 and BL6 are driven in accordance with data bit D1, and bit lines BL5 and BL7 are driven in accordance with data bit D0. With eight bit lines BL0 to BL7 being a unit, the same connection pattern is repeated. A column address is increased by four with eight bit lines being a unit. Assignment of a column address is the same in the set of eight bit lines. The same column address is assigned every four bit lines.

Between the set of bit lines BL0 to BL3 and the set of bit lines BL4 to BL7, associated data bits are interchanged. Column addresses 0 to 3 are assigned to bit lines BL0 to BL3, respectively. Similarly, column addresses 0 to 3 are assigned to bit lines BL4 to BL7, respectively. For example, when the column address "0" is designated, bit lines BL0 and BL4 are driven in accordance with data bits D0 and D1. With eight bit lines BL0 to BL7 being a unit, the corresponding relationship between data bits and bit lines is repeated. The column address is increased by four for each unit.

Therefore, always three bit lines exist between bit lines that are simultaneously driven to a selected state, and magnetic field interference at the time of writing data bits D0 and D1 can be suppressed with reliability.

In the arrangement of FIG. 13, the column address "4" is assigned to bit line BL8 in the not-shown next bit line unit.

Figure 14:
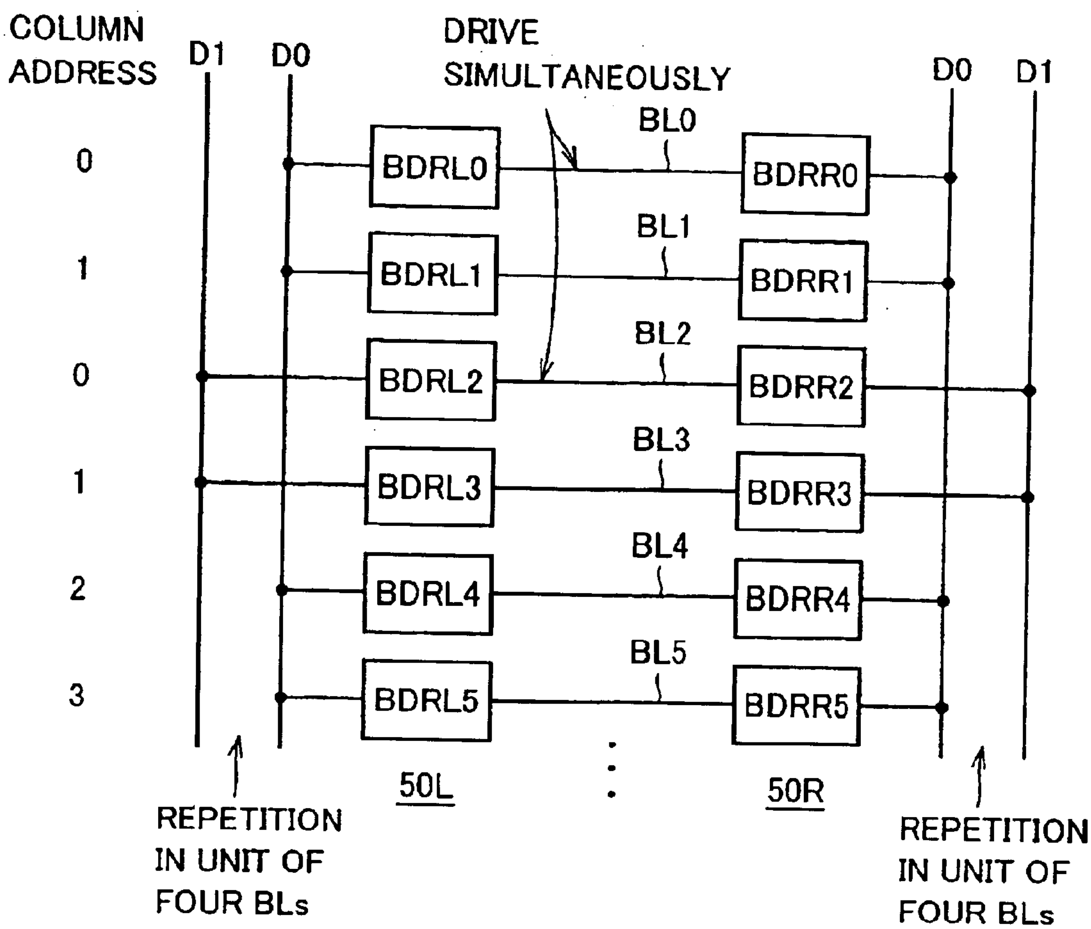
FIG. 14 is a diagram showing another correspondence between a bit line and write data in the second embodiment of the present invention.

FIG. 14 is a diagram schematically showing an example of a modification in the corresponding relationship between bit lines and data bits. In FIG. 14, bit lines BL0 to BL5 are representatively shown. In write control circuit 50L, bit line drive circuits BDRL0 to BDRL5 are provided for bit lines BL0 to BL5, respectively. In write control circuit 50R, bit line drive circuits BDRR0 to BDRR5 are provided in correspondence to bit lines BL0 to BL5, respectively. Data bits D0 and D1 are alternately assigned every bit line unit of two bit lines. Specifically, bit lines BL0 and BL1 are driven in accordance with data bit D0. Bit lines BL2 and BL3 are driven in accordance with data bit D1. Bit lines BL4 and BL5 are driven in accordance with data bit D0.

Column addresses 0 and 1 are assigned to bit lines BL0 and BL1, respectively. Column addresses 0 and 1 are assigned to bit lines BL2 and BL3, respectively. Column addresses 2 and 3 are assigned to bit lines BL4 and BL5, respectively. Column addresses different by one are assigned to bit lines in the bit line unit, that is, adjacent bit lines associated with the same data bit. Every unit of two bit lines, the column address is increased by two.

Therefore, with four bit lines being one group, one of two bit lines corresponding to data bit D0 is selected and one of two bit lines corresponding to data bit D1 is selected. For example, when the column address is "0", bit lines BL0 and BL2 are simultaneously driven. In this case, bit line BL1 exists between bit lines BL0 and BL2 that are driven simultaneously, and magnetic field interference by data write currents flowing in bit lines BL0 and BL2 can be sufficiently suppressed.

In the arrangement of FIG. 14, with four adjacent bit lines being a unit, adjacent two bit lines are connected to the same internal data line. In this case, a set of 2N bit lines is used as a unit, N bit lines are associated with data bit D0, the remaining N adjacent bit lines are associated with data bit D1, and the same address is sequentially assigned to the N bit lines, thereby enabling bit lines spaced apart by N bit lines to be driven simultaneously.

When data is formed of M bits, in the case of the arrangement shown in FIG. 13, M adjacent bit lines are sequentially associated with different data bits, the correspondence between bit lines and the data bits in the set of M bit lines are disposed so as to be mirror-symmetrical in a set of 2•M bit lines. The corresponding relation between data bits and bit lines is repeated in a unit of 2•M bit lines. The same column address is assigned every M bit lines. In a set of M bit lines, one bit line is selected.

In the case where M data bits are used in the arrangement shown in FIG. 14, different data bits are sequentially assigned to the respective sets of adjacent two bit lines. In this case, with 2•M bit lines being a set, the address is updated by two for each set. In the 2•M bit lines, column addresses of adjacent two bit lines are different from each other. In the set of 2•M bit lines, M bit lines of an even column address or odd column address are selected.

Through correlation between data bits and bit lines as described above, the configurations shown in FIGS. 13 and 14 can be easily expanded for parallel writing of M-bit data.

As described above, according to the second embodiment, bit lines sandwiching at least one bit line are simultaneously selected and data of a plurality of bits is written in parallel. Therefore, occurrence of a magnetic field failure caused by magnetic field interference of the induced magnetic fields by the data write currents can be prevented and multi-bit data can be written accurately.

Third Embodiment

Figure 15:
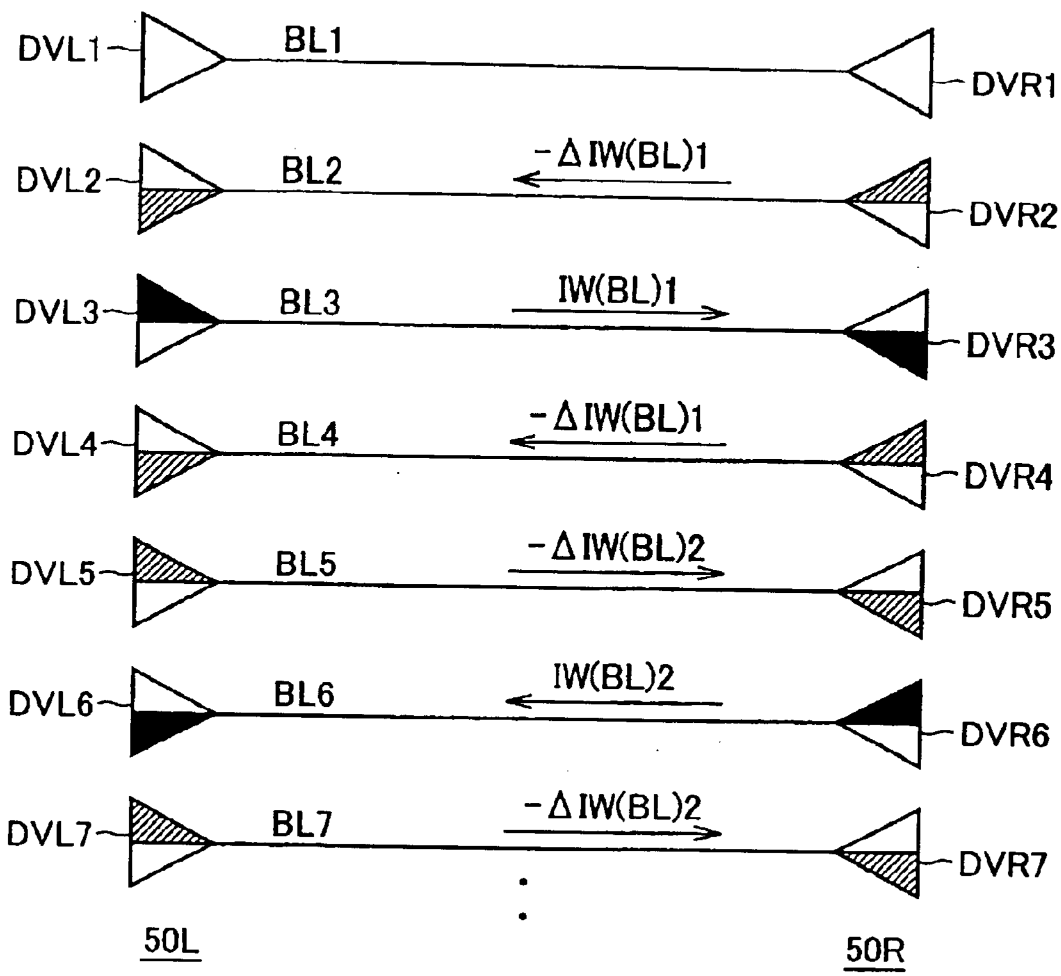
FIG. 15 is a diagram schematically showing the configuration of main components of a semiconductor memory device according to a third embodiment of the present invention.

FIG. 15 is a diagram schematically showing the configuration of a main part of a semiconductor memory device according to a third embodiment of the present invention. In FIG. 15, bit lines BL1 to BL7 are representatively shown. In write control circuit 50L, bit line current drivers DVL1 to DVL7 are provided in correspondence to bit lines BL1 to BL7, respectively. In write control circuit 50R, bit line current drivers DVR1 to DVR7 are provided in correspondence to bit lines BL1 to BL7, respectively. Each of bit line current drivers DVL1 to DVL7 and DVR1 to DVR7 has the configuration similar to that of bit line current driver DV shown in FIG. 9.

In the configuration shown in FIG. 15, two bit lines sandwiching two bit lines are simultaneously driven to a selected state. Data is written to the bit lines simultaneously selected. Therefore, in the configuration shown in FIG. 15, 2-bit data is written.

FIG. 15 shows, as an example, a case where bit lines BL3 and BL6 are simultaneously driven. To bit line BL3, a data write current IW(BL)1 is supplied from bit line current driver DVL3 to bit line current driver DVR3 in accordance with write data. In bit line BL6, a data write current IW(BL)2 is supplied from bit line current driver DVR6 to bit line current driver DVL6. The magnitudes of data write currents IW(BL)1 and IW(BL)2 are the same. Since the logic levels of write data are different from each other, the directions of data write currents IW(BL)1 and IW(BL)2 are opposite to each other.

In the configuration shown in FIG. 15, a cancel current is caused to flow to bit lines adjacent to a selected bit line. Specifically, in bit lines BL2 and BL4, a cancel current −ΔIW(BL)1 is caused to flow in the direction opposite to data write current IW(BL)1. In bit lines BL5 and BL7, a cancel current −ΔIW(BL)2 is caused to flow in the direction opposite to data write current IW(BL)2. The magnitudes of each of cancel currents −ΔIW(BL)1 and −ΔIW(BL)2 is about 10 to 30% of that of each of data write currents IW(BL)1 and IW(BL)2.

In the configuration shown in FIG. 15, therefore, occurrence of erroneous writing in adjacent bit lines caused by leakage of a magnetic field induced by a data write current flowing in a selected bit line can be prevented with reliability. A plurality of (two in FIG. 15) bit lines are disposed between bit lines simultaneously driven. Also in the case of simultaneously driving a plurality of bit lines in accordance with data of reverse logic levels, occurrence of a write magnetic field failure due to magnetic field interference of the write magnetic fields can be prevented, and data can be written accurately.

Figure 16:
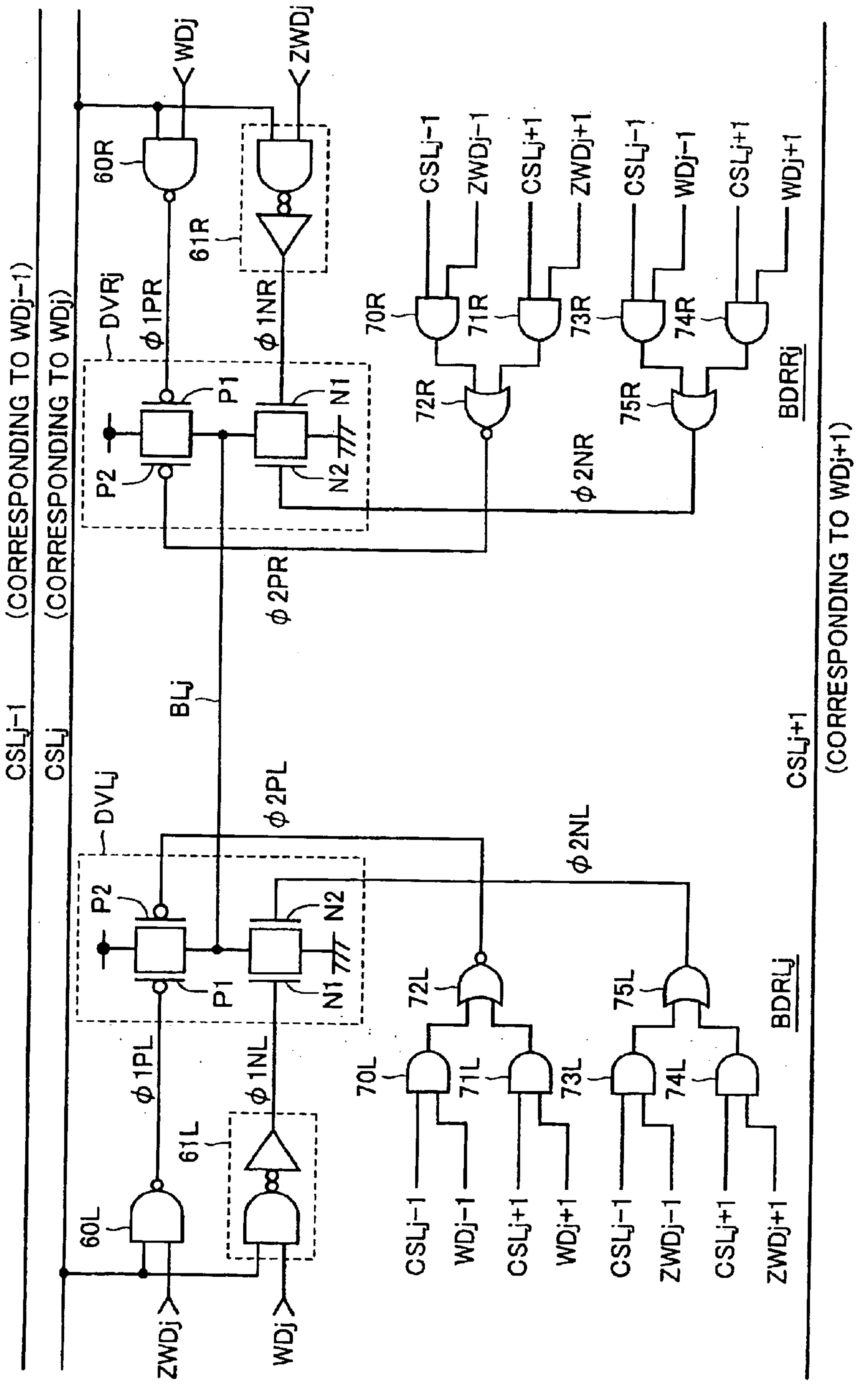
FIG. 16 is a diagram showing an example of the configuration of a bit line drive circuit according to the third embodiment of the present invention.

FIG. 16 is a diagram showing the configuration of the write control circuit according to the third embodiment of the present invention. In FIG. 16, the configuration of bit line drive circuits BDRLj and BDRRj arranged in correspondence to bit line BLj is representatively shown. When selected, bit line (BLj−1) selected according to column selection signal CSLj−1 is driven according to a data signal WDj−1.When selected, bit line BLj selected according to column selection signal CSLj is driven according to data signal WDj. Bit line BLj+1 selected according to column selection signal CSj+1 is driven according to a data signal WDj+1. Data signals WDj−1, WDj, and WDj+1 are generated on the basis of write data bits Dj−1, Dj, and Dj+1, respectively. Since an operation of writing multi-bit data will be described below, internal write data is referred as a data signal.

Similarly to the configuration of the bit drive circuit shown in FIG. 10, bit line drive circuit BDRLj includes: an NAND circuit 60L for generating control signal ϕ1PL in accordance with column selection signal CSLj and a complementary write data signal ZWDj; an AND circuit 61N for generating control signal ϕ1NL in accordance with column selection signal CSj and write data signal WDj; and a bit line current driver DVLj for driving bit line BLj in accordance with control signals ϕ1PL and ϕ1NL and control signal ϕ2PL and ϕ2NL which will be described later. Similarly to the configuration shown in FIG. 10, bit line current driver DVLj includes: P-channel MIS transistors P1 and P2 receiving control signals ϕ1PL and ϕ2PL at their respective gates and, when made conductive, supplying a current to bit line BLj; and N-channel MIS transistors N1 and N2 receiving control signals ϕ1NL and ϕ2NL at their respective gates and, when made conductive, discharging bit line BLj. According to control signals ϕ1PL and ϕ1NL, a data write current is supplied to bit line BLj.

Bit line drive circuit BDRLj further includes: an AND circuit 70L receiving column selection signal CSLj−1 and write data signal WDj−1;an AND circuit 71L receiving column selection signal CSLj+1 and write data signal WDj+1; an NOR circuit 72L receiving output signals from AND circuits 70L and 71L and generating control signal ϕ2PL; an AND circuit 73L receiving column selection signal CSLj−1 and complementary write data signal ZWDj−1;an AND circuit 74L receiving column selection signal CSLj+1 and complementary write data signal ZWDj+1; and an OR circuit 75L receiving output signals of AND circuits 73L and 74L and generating control signal 42NL.

Write data signals WDj−1 and ZWDj−1 are data signals complementary to each other and represent write data to bit line BLj−1 selected by column selection signal CSLj−1n in writing data. Write data signals WDj+1 and ZWDj+1 are data signals complementary to each other and represent write data to bit line BLj+1 designated by column selection signal CSLj+1. The data signals are generated by a not-shown write driver or buffer circuit on the basis of a corresponding write data bit.

A data bit transmitted to each bit line is appropriately determined in accordance with the correspondence relationship between a bit line and a write data bit.

Similarly to the configuration shown in FIG. 10, bit line drive circuit BDRRj includes: an NAND circuit 60R receiving column selection signal CSLj and write data signal WDj and generating control signal ϕ1PR; an NAND circuit 61R receiving column selection signal CSLj and complementary write data signal ZWDj and generating control signal ϕ1NR; and a bit line current driver DVRj driving bit line BLj in accordance with control signals ϕ1PR and ϕ1NR and control signals ϕ2PR and ϕ2NR which will be described later. Bit line current driver DVRj has a configuration similar to that shown in FIG. 10. Corresponding parts are designated by the same reference numerals and their detailed description will not be repeated.

Bit line drive circuit BDRRj further includes: an AND circuit 70R receiving column selection signal CSLj−1 and complementary write data signal ZWDj−1; an AND circuit 71R receiving column selection signal CSlj+1 and complementary write data signal ZWDj+1; an NOR circuit 72R receiving output signals of AND circuits 70R and 71R and generating control signal ϕ2PR; an AND circuit 73R receiving column selection signal CSLj−1 and write data signal WDj−1;an AND circuit 74R receiving column selection signal CSLj+1 and write data signal WDj+1; and an OR circuit 75R receiving output signals of AND circuits 73R and 74R and generating control signal ϕ2NR.

The operation of bit line drive circuits BDRLj and BDRRj in the case when bit line BLj is selected is the same as that of the bit line drive circuit shown in FIG. 10. Specifically, when bit line BLj is selected, both column selection signals CSLj−1 and CSLj+1 are in a non-selected state, control signals ϕPL and ϕPR attain H level, both control signals ϕ2NL and ϕ2NR attain L level, and bit line current drivers DVLj and DVRj drive bit line BLj in accordance with control signals ϕ1PL, ϕ1NL, ϕ1PR, and ϕ1NR. The direction of the data write current in driving bit line BLj is set according to write data signals WDj and ZWDj. The operation in supplying data write current IW(3L) to bit line BLj is the same as that of the bit line drive circuit shown in FIG. 10 and the detailed description will not be repeated.

Figures 17, 18:
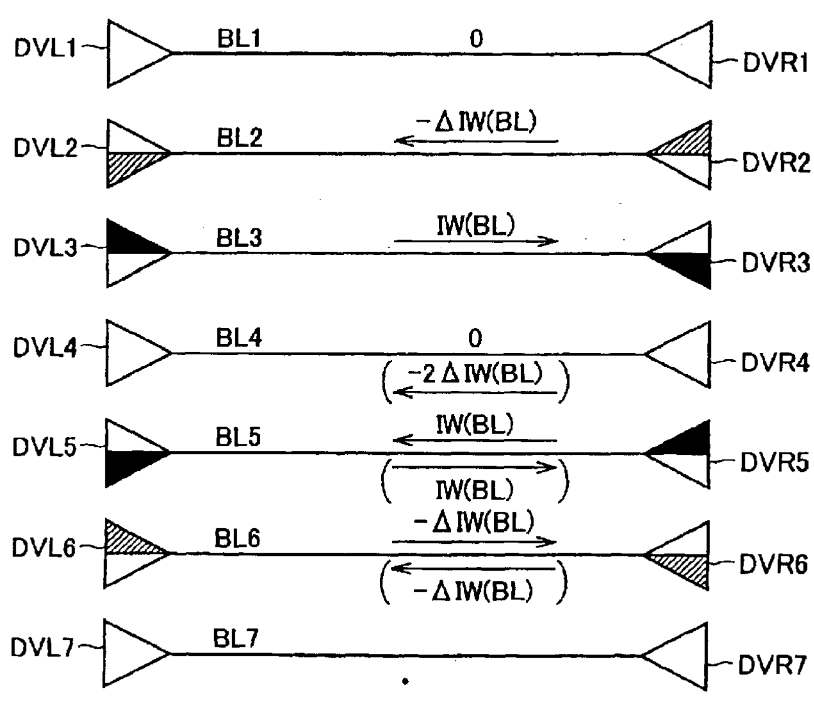
FIG. 17 is a diagram showing the logic of a control signal of the bit line drive circuit shown in FIG. 16 in the form of a truth table.
FIG. 18 is a diagram schematically showing the configuration of a main portion of a semiconductor memory device according to a third embodiment of the present invention and a bit line current.

FIG. 17 is a diagram showing an example of logic levels of ϕ2PL, ϕ2NL, ϕ2PR and ϕ2NR in the case when an adjacent bit line is selected. The operation of bit line drive circuits BDRLj and BDRRj when an adjacent bit line is selected will be described below with reference to FIG. 17.

(1) When column selection signal CSLj−1 is selected, the states of control signals vary according to the logic levels of the write data signals to bit line BLj−1 designated by column selection signal CSLj−1.

(i) When write data signal WDj−1 is at H level, in bit line drive circuit BDRLj, an output signal of AND circuit 70L attains H level and, accordingly, control signal ϕ2PL from NOR circuit 72L attains L level. Column selection signal CSLj+1 is in a non-selected state and output signals of AND circuits 71L and 74L are at L level. Since complementary write data signal ZWDj−1 attains L level, an output signal of AND circuit 73L is at L level and, similarly, control signal ϕ2NL from OR circuit 75L attains L level. Therefore, in bit line current driver DVLj, MIS transistor P2 is in an on state, and MIS transistor N2 is in an off state. Column selection signal CSLj is in a non-selected state, and both MIS transistors P1 and N1 are in an off state. Therefore, a cancel current is supplied from bit line current driver DVLj to bit line BLj via MIS transistor P2.

In bit line drive circuit BDRRj, both output signals from AND circuits 70R and 71R attain L level and, accordingly, control signal ϕ2PR from NOR circuit 72R attains H level. An output signal from AND circuit 73R is at H level, an output signal of AND circuit 74R is at L level, and control signal ϕ2NR from OR circuit 75R becomes H level. Therefore, in bit line current driver DVRj, MIS transistor P2 is in an off state, MIS transistor N2 is in an on state, and bit line current driver DVRj discharges the current on bit line BLj. Therefore, in bit line BLj, the cancel current flows from bit line current driver DVLj toward bit line current driver DVRj.

(ii) When write data WDjϕ1 is at L level, in bit line drive circuit BDRLj, output signals of AND circuits 70L and 71L are at L level and control signal ϕ2PL from NOR circuit 72L attains H level. Since complementary write data signal ZWDj−1 attains H level, an output signal of AND circuit 73L attains H level, and control signal ϕ2NL from OR circuit 75L attains H level. In bit line current driver DVLj, MIS transistor P2 is in the off state and MIS transistor N2 is in the on state. When an adjacent column is selected, MIS transistors P1 and N1 are both in the off state.

In bit line drive circuit BDRRj, in contrast, an output signal of AND circuit 70R attains H level and, accordingly, control signal ϕ2PR from NOR circuit 72R attains L level. Further, both output signals of AND circuits 73R and 74R are at L level and, accordingly, signal ϕ2NR from OR circuit 75R attains L level. Thus, in bit line current driver DVRj, MIS transistor P2 is in the on state and MIS transistor N2 is in the off state. Therefore, in this state, a cancel current flows from bit line current driver DVRj to bit line current driver DVLj via bit line BLj.

(2) The operation of bit line drive circuits BDRLj and BDRRj when column selection signal CSLj+1 is selected is the same as that when column selection signal CSLj−1 is selected. According to write data signals WDj+1 and ZWDj+1, the logic levels of control signals ϕ2PL, ϕ2NL, ϕ2PR, and ϕ2NR are determined.

Specifically, when write data signal WDj+1 is at H level, both control signals ϕ2PL and ϕ2NL attain L level, and control signals ϕ2PR and ϕ2NR attain H level. In bit line BLj, a cancel current flows from bit line current driver DVLj to bit line current driver DVRj.

When write data signal WDj+1 is at L level, both control signals ϕ2PL and ϕ2NL attain H level and both control signals ϕ2PR and ϕ2NR attain L level. In this state, a cancel current flows from bit line current driver DVRj toward bit line current driver DVLj via bit line DBj.

Therefore, also in the case where bit lines sandwiching a plurality of bit lines are simultaneously driven to the selected state, a cancel current according to write data of the adjacent selected bit line can be caused to flow through bit lines adjacent to the selected bit line. Thus, magnetic field interference can be suppressed with reliability.

As described above, according to the third embodiment of the present invention, bit lines sandwiching a plurality of bit lines are driven simultaneously to the selected state, and a cancel current is caused to flow on bit lines adjacent to the selected bit lines. The magnetic field interference in the selected and non-selected bit lines is suppressed with reliability and data can be written accurately.

Fourth Embodiment

FIG. 18 is a diagram schematically showing currents on bit lines according to a fourth embodiment of the present invention. In FIG. 18, bit lines BL1 to BL7 are representatively shown. On one side of bit lines BL1 to BL7, bit line current drivers DVL1 to DVL7 are provided. On the other side of bit lines BL1 to BL7, bit line current drivers DLR1 to DVR7 are provided.

In the arrangement shown in FIG. 18, two bit lines between which one bit line intervenes are simultaneously selected. FIG. 18 shows, as an example, the state where bit lines BL3 and BL5 are simultaneously selected. The configuration in which two bit lines between which one bit line intervenes are simultaneously selected is accomplished by using, for example, the connection between the bit lines and the internal write data lines shown in FIG. 14. Write data may be 2-bit data, 4-bit data, 8-bit data, or 16-bit data.

In the arrangement shown in FIG. 18, for bit line BL4 between bit lines (for example, bit lines BL3 and BL5) simultaneously selected, the drive current amount is adjusted according to currents flowing in selected bit lines BL3 and BL5. Specifically, when reverse data are written to bit lines BL3 and BL5, that is, data write currents flow in the opposite directions, the cancel current is not caused to flow in bit line BL5. On the other hand, when data write current IW(BL) flows in the same direction in bit lines BL3 and BL5, a cancel current −2•ΔIW(BL) of a double amount is caused to flow through bit line BL4 in the direction opposite to the data write current.

To bit lines BL2 and BL6, according to the data write currents flowing in bit lines BL3 and BL5, cancel current −ΔIW(BL) is caused to flow in the opposite directions in accordance with the data write currents flowing in bit lines BL3 and BL5.

Therefore, in the case where two bit lines between which one bit line intervenes are selected simultaneously, by selectively supplying the cancel current to the intervening bit line (BL4), the cancel current can be caused to flow accurately to each of non-selected bit lines, and the magnetic field interference can be suppressed.

Figure 19:
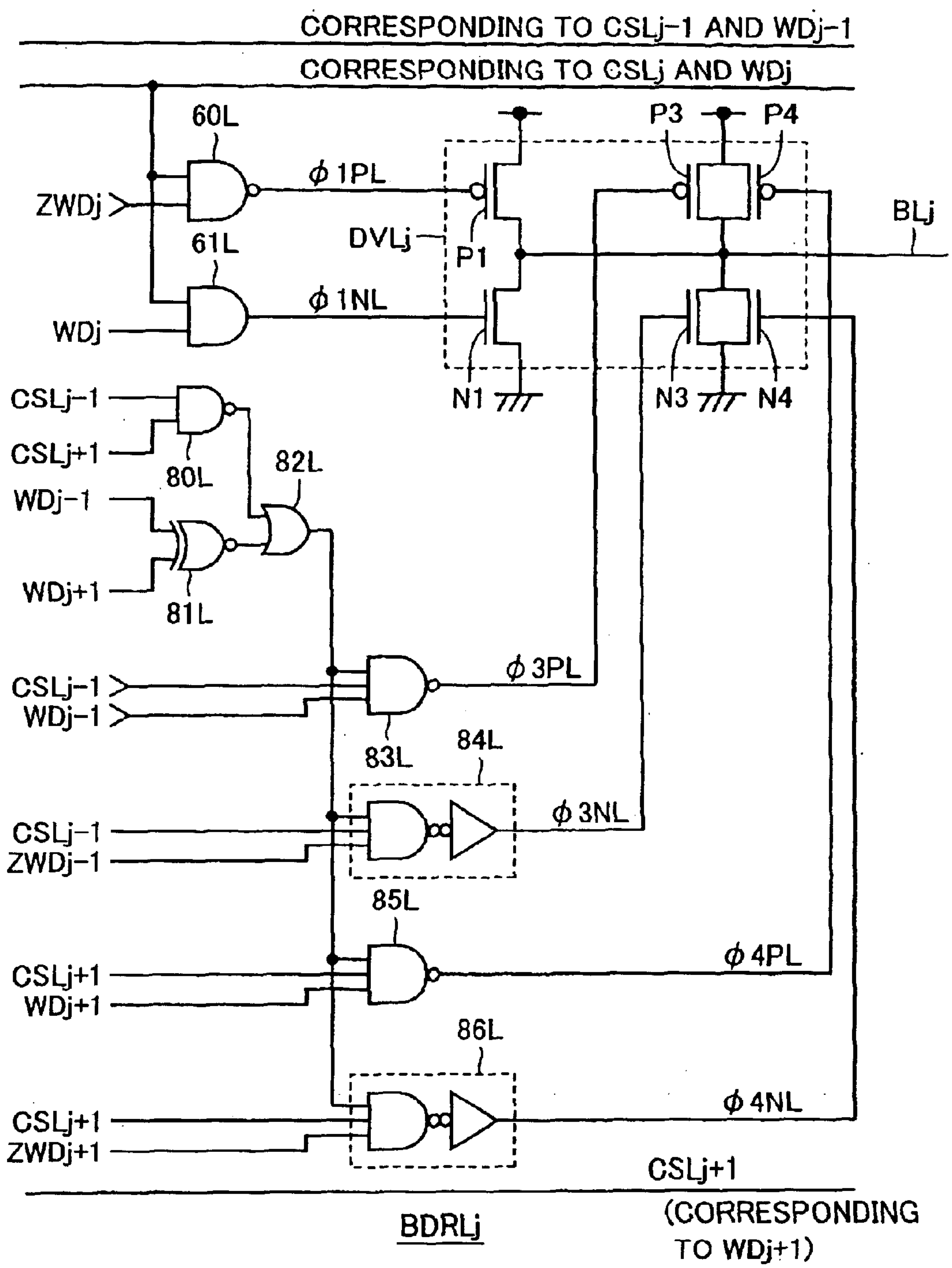
FIG. 19 is a diagram showing an example of the configuration of a right-side bit line drive circuit in the fourth embodiment of the present invention.

FIG. 19 is a diagram showing an example of the configuration of the bit line drive circuit according to the fourth embodiment of the present invention. In FIG. 19, the configuration of bit line drive circuit BDRLj disposed in correspondence to bit line BLj is shown. The correspondence relationship among a bit line, a column selection signal and a write signal is similar to that in the third embodiment shown in FIG. 16.

Bit line drive circuit BDRLj includes: NAND circuit 60L for generating control signal ϕ1PL in accordance with column selection signal CSLj and complementary data signal ZWDj; AND circuit 61L receiving column selection signal CSLj and write data signal WDj and generating control signal ϕ1NL; and bit line current driver DVLj for supplying the data write current to bit line BLj in accordance with control signals ϕ1PL and ϕ1NL. Bit line current driver DVLj includes MIS transistors P1 and M1 that are selectively made conductive according to control signals (11PL and ϕ1NL, respectively. The relationship between control signals ϕ1PL and ϕ1NL and conduction/non-conduction state of MIS transistors P1 and N1 is the same as that in the bit line current driver shown in FIG. 10.

Bit line current driver DVLj includes: in addition to MIS transistors P1 and N1 for driving data write current, P-channel MIS transistors P3 and P4 connected in parallel between the power supply node and bit line BLj to supply cancel current to bit line BLj when an adjacent bit line is selected; and N-channel MIS transistors N3 and N4 connected in parallel between bit line BLj and the ground node. Control signals ϕ3PL and ϕ4PL are applied to the gates of P-channel MIS transistors P3 and P4. Control signals ϕ3NL and ϕ4NL are applied to the gates of MIS transistors N3 and N4.

When made conductive, each of MIS transistors P3, P4, N3, and N4 supplies a current of 10 to 30% of data write current IW.

Bit line drive circuit BDRLj further includes: an NAND circuit 80L receiving column selection signals CSLj−1 and CSLj+1; an EXNOR circuit 81L receiving write data signals WDj−1 and WDj+1; an OR circuit 82L receiving output signals of NAND circuit 80L and EXNOR circuit 81L; an NAND circuit 83L receiving an output signal of OR circuit 82L, column selection signal CSLj−1 and write data signal WDj−1 and generating control signal ϕ3PL; an AND circuit 84L receiving an output signal of OR circuit 82L, column selection signal CSLj−1, and complementary write data signal ZWDj−1 and generating control signal ϕ3NL; an NAND circuit 85L receiving an output signal of OR circuit 82L, column selection signal CSLj+1, and write data signal WDj+1 and generating control signal ϕ4PL; and an AND circuit 86L receiving an output signal of OR circuit 82L, column selection signal CSLj+1, and complementary write data signal WDj+1 and generating control signal ϕ4NL. To bit lines BLj−1 and BLj+1 driven to a selected state in accordance with column selection signals CSLj−1 and CSLj+1, a current is supplied in accordance with write data signals WDj−1 and WDj+1.

FIG. 20 is a diagram showing, in a truth table form, logic levels of control signals of bit line drive circuit BDRLj shown in FIG. 19. When bit line BLj is selected, the drive current of the selected bit line BL is determined by control signals ϕ1PL and ϕ1NL in accordance with write data signals WDj and ZWDj. Therefore, in FIG. 20, control signals ϕ1PL and ϕ1NL are not shown.

Referring to FIG. 20, the operation of bit line drive circuit BDRLj shown in FIG. 19 will be briefly described.

(1) When both column selection signals CSLj−1 and CSLj+1 are at L level and both adjacent bit lines are in a non-selected state, control signal ϕ3PL from NAND circuit 83L and control signal ϕ4PL from NAND circuit 85L are at H level, and both control signals ϕ3NL and ϕ4NL from AND circuits 84L and 86L are at L level. Therefore, all of MIS transistors P3, P4, N3, and N4 are in the non-conductive state. At this time, bit line drive circuit BDRLj does not drive cancel current.

(2) When column selection signal CSLj−1 is in the non-selected state and column selection signal CSLj+1 is in the selected state (H level), according to the logic level of write data WDj+1 corresponding to column selection signal CSLj+1, the cancel current to bit line BLj is determined. Since column selection signal CSLj−1 is in the non-selected state, control signals ϕ3PL and ϕ3NL are at the H and L levels, respectively. Since only column selection signal CSLj+1 is in the selected state, an output signal of NAND circuit 86L is at H level and, accordingly, an output signal of OR circuit 82L is at H level.

(i) When write data signal WDj+1 is at H level, both control signals ϕ4PL and ϕ4NL are at L level, P-channel MIS transistor P4 enters the on state, MIS transistor N4 is in the off state, and cancel current ΔIW is supplied to bit line BLj. In FIG. 20, the direction of current supplied from bit line current driver DVLj to bit line BLj is shown by an arrow mark.

(ii) When write data signal WDj+1 is at L level, both control signals ϕ4PL and ϕ4NL are at H level, MIS transistor P4 is in the off state, and MIS transistor N4 enters the on state. Therefore, in this case, cancel current ΔIW is drawn from bit line BLj.

(3) When column selection signal CSLj−1 is in the selected state and column selection signal CSLj+1 is in a non-selected state, the cancel current of bit line BL1 is determined in accordance with write data signal WDj−1. In this case, in a manner similar to the case when column selection signal CSLj+1 is selected, when write data signal WDj−1 is at H level, both control signals ϕ3PL and ϕ3NL attain H level. When write data signal WDj−1 is at L level, control signals ϕ3PL and ϕ3NL attain H level. In this case, both control signals ϕ4PL and ϕ4NL are at the H and L levels, respectively, and MIS transistors P4 and N4 are in the off state. Therefore, cancel current ΔIW to bit line BLj is caused to flow in the direction of the arrow mark of FIG. 20 by MIS transistor P3 or N3.

(4) When both column selection signals CSLj−1 and CSLj+1 are driven to the selected state, according to whether the logic levels of write data of bit lines on both sides of bit line BLj match or mismatch, the intensity of the cancel current is determined. When both column selection signals CSLj−1 and CSLj+1 are at H level, an output signal of NAND circuit 80L is L level, and OR circuit 82L operates as a buffer circuit.

(i) When the logic levels of write data signals WDj−1 and WDj+1 are different from each other, an output signal of EXNOR circuit 81L attain L level and, accordingly, an output signal of OR circuit 82L attains L level. In this case, therefore, similarly to the state of the non-selected state, irrespective of the logic levels of write data signals WDj−1 and WDj+1, control signals ϕ3PL and ϕ4PL are H level and ϕcontrol signals ϕ3NL and ϕ2NL are each at L level. All of MIS transistors P3, P4, N3, and N4 are in the non-conductive state, and no cancel current flows.

(ii) When the logic levels of write data signals WDj−1 and WDj+1 match each other, an output signal of EXNOR circuit 81L attains H level and, accordingly, an output signal of OR circuit 82L attains H level. When both write data signals WDj−1 and WDj+1 are at L level, all of control signals ϕ3PL, ϕ3NL, ϕ4PL, and ϕ4NL become H level. In this case, both MIS transistors N3 and N4 are turned on and MIS transistors P3 and P4 are in the off state. Therefore, cancel current of 2•ΔIW is drawn from bit line BLj. On the other hand, when both write data signals WDj−1 and WDj+1 are at H level, all of control signals ϕ3PL, ϕ3NL, ϕ4PL, and ϕ4NL are at L level, both MIS transistors P3 and P4 are in the on state, and both MIS transistors N3 and N4 are in the off state. Therefore, cancel current of 2•IW is supplied to bit line BLj.

Therefore, when adjacent bit lines on both sides are both driven to the selected state, the cancel current can be set to 0 or 2•ΔIW in accordance with write data on adjacent bit lines and magnetic field interference can be prevented accurately.

Figure 21:
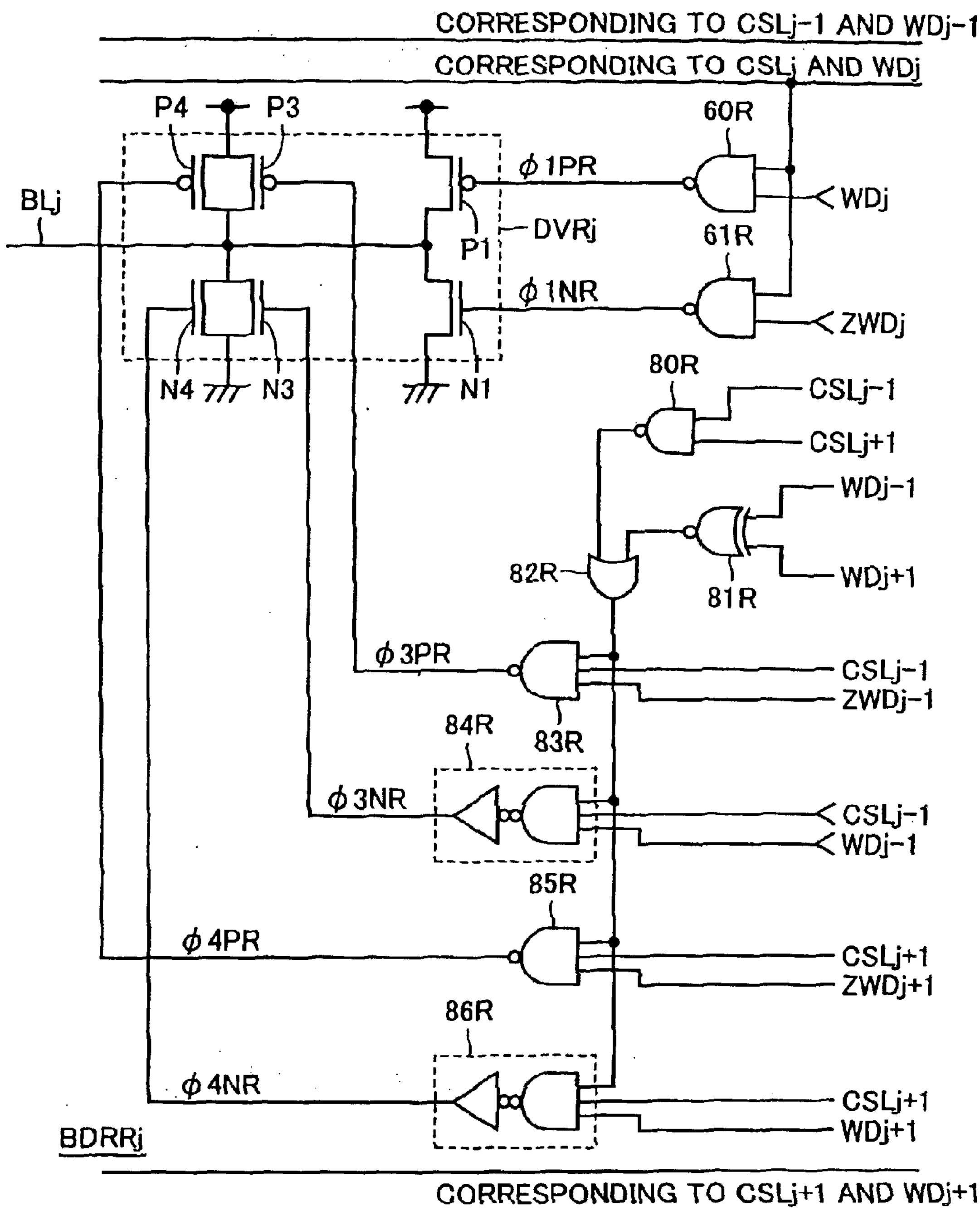
FIG. 21 is a diagram showing an example of the configuration of a left-side bit line drive circuit in the fourth embodiment of the present invention.

FIG. 21 is a diagram showing an example of the configuration of bit line drive circuit BDRRj. In FIG. 21, bit line drive circuit BDRRj includes: NAND circuit 60R for generating control signal ϕ1PR in accordance with column selection signal CSLj and write data signal WDj; NAND circuit 61R receiving column selection signal CSLj and complementary write data signal ZRDj and generating control signal ϕ1NR; and bit line current driver DVRj for supplying the write data current to bit line BLj in accordance with control signal ϕ1PR and ϕ1NR. The charging/discharging operation of bit line BLj by control signals ϕ1PR and ϕ1NR is the same as the operation of the bit line current driver shown in FIG. 10.

Bit line current driver DVRj further includes P-channel MIS transistors P3 and P4 and N-channel MIS transistors N3 and N4 for supplying the cancel current to bit line BLj. P-channel MIS transistors P3 and P4 are connected between the power supply node and bit line BLj and receive control signals ϕ3PR and ϕ4PR at their respective gates. N-channel MIS transistors N3 and N4 are connected in parallel between bit line BLj and the ground node and receive control signals ϕ3NR and ϕ4NR at their gates, respectively. The configuration of bit line current driver DVRj is the same as that of bit line current driver DVLj shown in FIG. 19. When made conductive, each of MIS transistors P3, P4, N3, and N4 drives current of about 10 to 30% of data write current IW.

Bit line drive circuit BDRRj further includes: NAND circuit 80R receiving column selection signals CSLj−1 and CLSj+1; EXNOR circuit 81R receiving write data signals WDj−1 and WDj+1; OR circuit 82R receiving output signals of NAND circuit 80R and EXNOR circuit 81R; NAND circuit 83R receiving an output signal of OR circuit 82R, column selection signal CSLj−1 and write data signal ZRDR1 and generating control signal φ3PR; AND circuit 84R receiving an output signal of OR circuit 82R, column selection signal CSLj−1 and write data signal WDj−1 and generating control signal φ3NR; NAND circuit 85R receiving an output signal of OR circuit 82R, column selection signal CSLj+1, and complementary write data signal ZWDj+1 and generating control signal φ4PR; and AND circuit 86R receiving an output signal of OR circuit 82R, column selection signal CSLj+1, and write data signal WDj+1 and generating control signal φ4NR.

The circuit configuration of a part for generating controls signals φ3PR, φ3NR, φ4PR, and φ4NR for generating the cancel current is the same as that of the corresponding part in bit line drive circuit BDRLj shown in FIG. 19 except for the positions of complementary signals of write data signals are interchanged in position.

FIG. 22 is a diagram showing a truth table of control signals of the bit line drive circuit shown in FIG. 21. As shown in FIG. 22, in bit line drive circuit BDRRj shown in FIG. 21, the positions of complementary signals of bit line drive circuit BDRLj and write data signals WDj−1 and WDj+1 shown in FIG. 19 are interchanged, and the flowing direction of the cancel current is opposite to that in the bit line drive circuit shown in FIG. 19. Therefore, in the truth table shown in FIG. 22, by interchanging H level and L level of write data signals WDj−1 and WDj+1 at the time of supplying the cancel current, the cancel current supplying operation similar to that in the truth table shown in FIG. 20 is accomplished. The operation of bit line drive circuit BDRRj will be briefly described below.

When column selection signals CSLj−1 and CSLj+1 are both in the selected state, an output signal of NAND circuit 80R attains L level. Therefore, when the logic levels of write data signals WDj−1 and WDj+1 match with each other, an output signal of EXNOR circuit 81R attains H level and, according to the logic levels of write data signals WDj−1 and WDj+1, current of 2•IW is supplied or drawn to/from bit line BLj.

On the other hand, when the logic levels of write data signals WDj−1 and WDj+1 mismatch with each other, output signal of EXNOR circuit 81R attains L level and an output signal of OR circuit 82R attains L level. Therefore, control signals φ3PR and φ4PR attain H level and control signals φ3NR and φ4NR attain L level. In bit line current driver DVRj, all of MIS transistors P3, N3, P4, and N4 are in the off state, so that the cancel current is not charged/discharged.

In the case where one of column selection signals CSLj−1 and CSLj+1 is selected and the other is non-selected, according to the write data signal to the selected adjacent bit line, one of MIS transistors P3 and P4 or one of MIS transistors N3 and N4 is made conductive, and the cancel current of the magnitude of ΔIW is supplied to bit line BLj in the direction opposite to the data write current.

When both column selection signals CSLj−1 and CSLj+1 are in the non-selected state, control signals φ3PR and φ4PR are at H level and control signals φ3NR and φ4NR are at L level. In bit line current driver DVRj, all of MIS transistors P3, P4, N3, and N4 are in a non-conductive state and the cancel current is not driven to bit line BLj.

Therefore, even in the case where two bit lines sandwiching one bit line are simultaneously selected and data is written to the selected bit lines, by disposing the bit line drive circuit shown in FIGS. 19 and 21 for each bit line, the cancel current can be reliably caused to flow on bit line BLj so as to cancel off the magnetic field interference.

Also in the configuration of the fourth embodiment, the number of bits of write data is not limited to two bits, but may be other number of bits such as four bits and eight 8.

Fifth Embodiment

Figure 23:
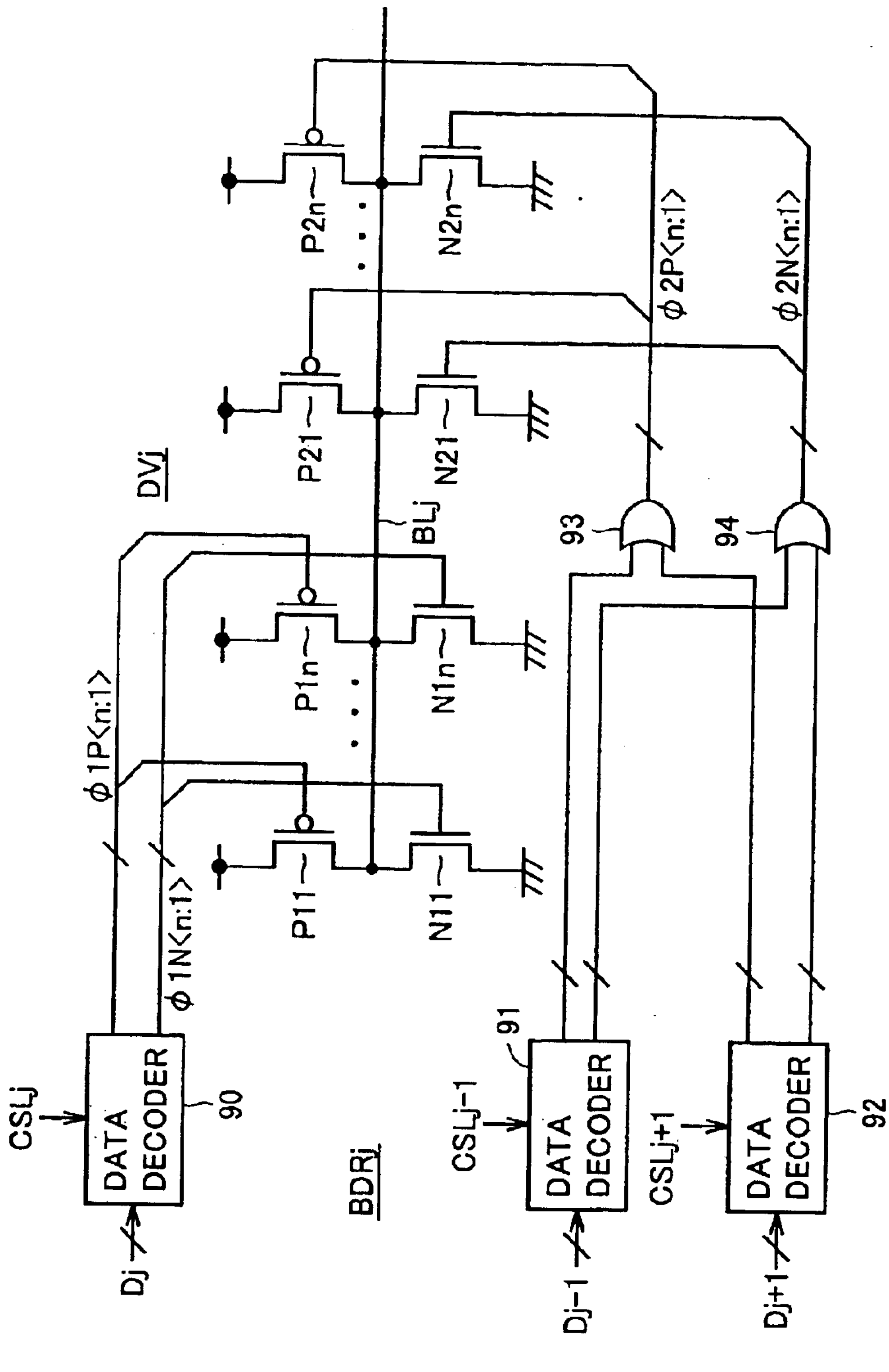
FIG. 23 is a diagram schematically showing the configuration of a bit line drive circuit according to a fifth embodiment of the present invention.

FIG. 23 is a diagram schematically showing the configuration of a bit line driver circuit according to a fifth embodiment of the present invention. FIG. 23 shows the configuration of bit line drive circuit BDRj for bit line BLj. The bit line drive circuit may be provided on any of both ends of bit line BLj. In FIG. 23, therefore, bit line drive circuit is indicated by reference symbol BDRj and, similarly, the bit line current driver is indicated by reference symbol DVj. Data Dj, Dj−1 and Dj+1 supplied to bit line drive circuit BDRj are data supplied to bit lines BLj, BLj−1, and BLj+1, respectively. Each of the data is multi-bit data. That is, in the configuration shown in FIG. 23, multi-value data is stored in a memory cell.

Bit line drive circuit BDRj includes a data decoder 90 that is activated upon selection of column selection signal CSLj and decodes multi-bit data Dj; a data decoder 91 that is activated when column selection signal CSLj−1 is activated and decodes multi-bit data Dj−1; a data decoder 92 that is, activated when column selection signal CSLj+1 is activated and decodes multi-bit data Dj+1; and OR circuits 93 and 94 for obtaining OR of output signals of data decoders 91 and 92.

Each of data decoders 90, 91, and 92, when activated, decodes supplied data and generates an output signal in accordance with a result of the decoding. OR circuits 93 and 94 are multi-bit circuits and generate control signals φ2P<n:1> and φ2N<n:1> by bit-by-bit-combining output signals of data decoders 91 and 91.

Bit line current driver DVj includes: P-channel MIS transistors P1*n* to P11 that are connected in parallel between the power supply node and bit line BLj and receive control signals φIP<n:1> from data decoder 90 at their respective gates; N-channel MIS transistors N1*n* to N11 that are connected in parallel between bit line BLj and the ground node and receive output signal φ1N<n:1> of data decoder 90 at their respective gates; P-channel MIS transistors P2*n* to P21 receiving output signal φ2P<n:1> of OR circuit 93 at their respective gates; and N-channel MIS transistors N2*n* to N21 that are connected in parallel between bit line BLj and the ground node and receive control signal φ2N<n:1> from OR circuit 94 at their respective gates.

By MIS transistors P11 to P1*n* and N11 to N1*n*, a current according to write data is supplied to bit line BLj. By MIS transistors P21 to P2*n* and N21 to N2*n*, cancel current for canceling out magnetic field interference is supplied to bit line BLj.

The size of each of MIS transistors P21 to P2*n* is smaller than that of each of MIS transistors P11 to P1*n* (current driving power is 10 to 30%), and the size of each of MIS transistors N21 to N2*n* is set to be smaller than that of each of MIS transistors N11 to N1*n* (for example, about 10 to 30%).

In the configuration of bit line drive circuit BDRj shown in FIG. 23, when bit line BLj is selected, MIS transistors P11 to P1*n* and N11 to N1*n* are selectively driven to an on state in accordance with multi-bit data Dj and write data current according to write data is supplied. When an adjacent bit line is selected, the cancel current according to data transmitted to the adjacent bit line is selectively passed to MIS transistors P21 to P2*n* and N21 to N2*n*.

Therefore, by disposing bit line drive circuits BDRj shown in FIG. 23 on both sides of bit line BLj, even in writing multi-bit data, cancel current for suppressing magnetic field interference can be generated accurately. Thus, accurate multi-value data can be written.

In writing multi-bit data, as operation points of write magnetic field to a memory cell, by arranging two operation points of different easy axis components per quadrant in the asteroid characteristic curve shown in FIG. 4, four-value data can be stored.

A memory cell utilizing a TMR element has been described above as a magnetic memory cell. The present invention can be applied to a memory cell for storing data by causing current to flow in a bit line and a write word line and setting a magnetization direction of a storage part by magnetic fields induced by the currents.

As described above, according to the present invention, when a bit line is driven in accordance with write data, cancel current is caused to flow in a corresponding bit line when an adjacent bit line is selected, or bit lines sandwiching one or more bit lines are selected. The magnetic field interference between bit lines can be reliably suppressed and data can be written accurately.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arranged in rows and columns;

a plurality of bit lines, disposed corresponding to the columns of the memory cells, each having the memory cells on a corresponding column coupled; and a plurality of bit line drive circuits disposed corresponding to the bit lines and supplying currents according to write data to a corresponding bit line, each bit line drive circuit including; a first drive circuit for supplying a first current to a corresponding bit line in accordance with write data to an adjacent column when the adjacent column is selected; and a second drive circuit for supplying a second current to the corresponding bit line in accordance with the write data to the corresponding column when the corresponding column is selected.

2. The semiconductor memory device according to claim 1, wherein said first current is smaller than said second current.

3. The semiconductor memory device according to claim 1, wherein when the adjacent column is selected, said first drive circuit causes said first current to flow in a direction opposite to a direction of a current flowing in said adjacent column.

4. The semiconductor memory device according to claim 1, further comprising:

a column selecting circuit for selecting a predetermined number of bit lines in parallel from said plurality of bit lines in accordance with an address signal, any adjacent bit lines in said predetermined number of bit lines sandwiching at least one bit line; and a write circuit for transmitting data bits in parallel to said predetermined number of bit lines selected in parallel.

5. The semiconductor memory device according to claim 4, wherein said column selecting circuit includes at least a circuit for simultaneously selecting two bit lines sandwiching one bit line, and said first drive circuit includes:

a detector for detecting match of logic levels of write data to bit lines adjacent on both sides in a row direction; and a driver for supplying said first current in accordance with a column selection signal to the bit lines adjacent on said both sides and an output signal of said detector.

6. The semiconductor memory device according to claim 4, wherein said first drive circuit stops supplying said first current when bit lines adjacent in a row direction are both selected and logic levels of write data to the adjacent bit lines on the both sides are different from each other.

7. The semiconductor memory device according to claim 4, wherein said first drive circuit increases said first current when bit lines adjacent in a row direction on both sides are both selected and logic levels of write data to said the adjacent bit lines on the both sides are identical.

8. The semiconductor memory device according to claim 1, wherein each bit line drive circuit has right-side and left-side drive circuits, disposed on both sides of a corresponding bit line respectively, operating complementary to each other to cause currents to flow in the corresponding bit line in opposite directions.

9. A semiconductor memory device comprising:

a plurality of magnetic memory cells arranged in rows and columns;

a plurality of bit lines, disposed corresponding to the columns of said plurality of magnetic memory cells, each coupling to the memory cells of a corresponding column;

a column selecting circuit for selecting a predetermined number of memory cell columns in parallel from the columns of said plurality of magnetic memory cell in accordance with an address signal, said any adjacent columns in said predetermined number of memory cell columns sandwiching at least one bit line; and a plurality of bit line drive circuits disposed corresponding to the bit lines and supplying a current to a corresponding bit line in accordance with write data and a column selection signal from said column selecting circuit.

10. The semiconductor memory device according to claim 9, wherein each bit line drive circuit has right-side and left-side drive circuits disposed on both sides of a corresponding bit line respectively and operating complementary to each other to cause currents to the corresponding bit line in opposite directions.

11. The semiconductor memory device according to claim 9, wherein each bit line drive circuit includes a cancel circuit for supplying, when a bit line of an adjacent column is selected, a current to a corresponding bit line so as to cancel out an influence of a magnetic field induced by a current flowing in the adjacent column on a magnetic memory cell of the corresponding column.

12. A semiconductor memory device comprising:

a plurality of memory cells arranged in rows and columns;

a plurality of bit lines, disposed corresponding to the columns of the memory cells, each having the memory cells on a corresponding column coupled; and bit line drive circuitry for supplying current according to write data to a corresponding bit line coupling to a memory cell having said write data written thereinto, said bit line drive circuitry including; a first drive circuit for supplying a first current to the corresponding bit line in accordance with write data to an adjacent column when the adjacent column is selected;

and a second drive circuit for supplying a second current to the corresponding bit line in accordance with the write data to a corresponding column when the corresponding column is selected.

13. The semiconductor memory device according to claim 12, wherein said first current is smaller than said second current.

14. The semiconductor memory device according to claim 12, wherein when the adjacent column is selected, said first drive circuit causes said first current to flow in a direction opposite to a direction of a current flowing in said adjacent column.

15. The semiconductor memory device according to claim 12, further comprising:

a column selecting circuit for selecting a predetermined number of bit lines in parallel from said plurality of bit lines in accordance with an address signal, any adjacent bit lines in said predetermined number of bit lines sandwiching at least one bit line; and a write circuit for transmitting data bits in parallel to said predetermined number of bit lines selected in parallel.

16. The semiconductor memory device according to claim 15, wherein said column selecting circuit includes at least a circuit for simultaneously selecting two bit lines sandwiching one bit line, and said first drive circuit includes:

a detector for detecting match of logic of write data to bit lines adjacent on both sides in a row direction; and a driver for supplying said first current in accordance with a column selection signal to the bit lines adjacent on said both sides and an output signal of said detector.

17. The semiconductor memory device according to claim 15, wherein said first drive circuit stops supplying said first current when bit lines adjacent in a row direction are both selected and logic levels of write data to the adjacent bit lines on the both sides are different from each other.

18. The semiconductor memory device according to claim 15, wherein said first drive circuit increases said first current when bit lines adjacent in a row direction on both sides are both selected and logic levels of write data to said the adjacent bit lines on the both sides are identical.

* * * * *